United States Patent
Wu et al.

(10) Patent No.: US 11,830,910 B2
(45) Date of Patent: Nov. 28, 2023

(54) SEMICONDUCTOR STRUCTURE HAVING AIR GAPS AND METHOD FOR MANUFACTURING THE SAME

(71) Applicant: TAIWAN SEMICONDUCTOR MANUFACTURING COMPANY, LTD., Hsinchu (TW)

(72) Inventors: Chieh-Han Wu, Hsinchu (TW); Hwei-Jay Chu, Hsinchu (TW); An-Dih Yu, Hsinchu (TW); Tzu-Hui Wei, Hsinchu (TW); Cheng-Hsiung Tsai, Hsinchu (TW); Chung-Ju Lee, Hsinchu (TW); Shin-Yi Yang, Hsinchu (TW); Ming-Han Lee, Hsinchu (TW)

(73) Assignee: TAIWAN SEMICONDUCTOR MANUFACTURING COMPANY, LTD., Hsinchu (TW)

(*) Notice: Subject to any disclaimer, the term of this patent is extended or adjusted under 35 U.S.C. 154(b) by 0 days.

(21) Appl. No.: 17/460,812

(22) Filed: Aug. 30, 2021

(65) Prior Publication Data
US 2023/0062416 A1   Mar. 2, 2023

(51) Int. Cl.
*H01L 29/06* (2006.01)
*H01L 21/768* (2006.01)
*H01L 23/528* (2006.01)
*H01L 21/8234* (2006.01)

(52) U.S. Cl.
CPC .... *H01L 29/0649* (2013.01); *H01L 21/76829* (2013.01); *H01L 21/823481* (2013.01); *H01L 23/5283* (2013.01)

(58) Field of Classification Search
CPC ........... H01L 29/0649; H01L 21/76829; H01L 21/62381; H01L 23/5283; H01L 23/5222; H01L 23/5226
USPC .......................................... 257/401; 438/284
See application file for complete search history.

(56) References Cited

U.S. PATENT DOCUMENTS

2017/0278786 A1*   9/2017   Inoue et al. ........ H01L 23/5222
2018/0033691 A1*   2/2018   You et al. ......... H01L 21/76883

* cited by examiner

*Primary Examiner* — Thinh T Nguyen
(74) *Attorney, Agent, or Firm* — Birch, Stewart, Kolasch & Birch, LLP

(57) ABSTRACT

A method for manufacturing a semiconductor structure includes forming a trench in a dielectric structure; forming a spacer layer on a lateral surface of the dielectric structure exposed by the trench; after forming the spacer layer, forming a first electrically conductive feature in the trench; removing at least portion of the dielectric structure to form a recess; forming an etch stop layer in the recess and over the first electrically conductive feature; and after forming the etch stop layer, depositing a dielectric layer in the recess and over the first electrically conductive feature.

20 Claims, 27 Drawing Sheets

500

```
┌─────────────────────────────────────────────────────────────┐
│ Forming trenches and at least one via opening in a dielectric structure │
│                           502                               │
└─────────────────────────────────────────────────────────────┘
                              ↓
┌─────────────────────────────────────────────────────────────┐
│     Forming a deposition layer to cover the dielectric structure     │
│                           504                               │
└─────────────────────────────────────────────────────────────┘
                              ↓
┌─────────────────────────────────────────────────────────────┐
│          Forming the deposition layer into spacer layers          │
│                           506                               │
└─────────────────────────────────────────────────────────────┘
                              ↓
┌─────────────────────────────────────────────────────────────┐
│            Forming first electrically conductive features            │
│                           508                               │
└─────────────────────────────────────────────────────────────┘
                              ↓
┌─────────────────────────────────────────────────────────────┐
│                 Forming a conductive capping layer                 │
│                           510                               │
└─────────────────────────────────────────────────────────────┘
                              ↓
┌─────────────────────────────────────────────────────────────┐
│     Forming recesses among the first electrically conductive features     │
│                           512                               │
└─────────────────────────────────────────────────────────────┘
                              ↓
┌─────────────────────────────────────────────────────────────┐
│    Forming an etch stop layer to cover the spacer layers and the    │
│                      conductive capping layer                       │
│                           514                               │
└─────────────────────────────────────────────────────────────┘
                              ↓
┌─────────────────────────────────────────────────────────────┐
│              Forming a dielectric layer having air gaps              │
│                           516                               │
└─────────────────────────────────────────────────────────────┘
                              ↓
┌─────────────────────────────────────────────────────────────┐
│            Forming at least one hole in the dielectric layer            │
│                           518                               │
└─────────────────────────────────────────────────────────────┘
                              ↓
┌─────────────────────────────────────────────────────────────┐
│         Forming at least one second electrically conductive feature         │
│                           520                               │
└─────────────────────────────────────────────────────────────┘
```

FIG. 13

SEMICONDUCTOR STRUCTURE HAVING AIR GAPS AND METHOD FOR MANUFACTURING THE SAME

BACKGROUND

The integration density of various electronic components, such as transistors, diodes, resistors, capacitors, etc., is being improved continuously in the semiconductor industry by continual reduction in minimum feature sizes. As the feature sizes are decreased, the distance between metal features is continually reduced. As the distance between the metal features reduces, the resulting parasitic capacitance between the metal features increases, leading to higher power consumption and larger resistance-capacitance (RC) time delays for an integrated chip. To improve performance and reduce the parasitic capacitance between the metal features, materials having low dielectric (k) values are used. However, such dielectric materials encounter a lot of processing problems that prevent further improvement of the dielectric constant.

The use of air gaps in semiconductor devices to enhance the isolation of the metal features is known in the art of semiconductor fabrication. Since air has a lowest k value (k=1), a growing trend has been to incorporate air gaps into the semiconductor devices to isolate the metal features and reduce line-to-line capacitance and the RC time delay.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

FIG. 13 is a flow diagram illustrating a method for manufacturing a semiconductor structure having air gaps in accordance with some embodiments.

DETAILED DESCRIPTION

Figure 1:
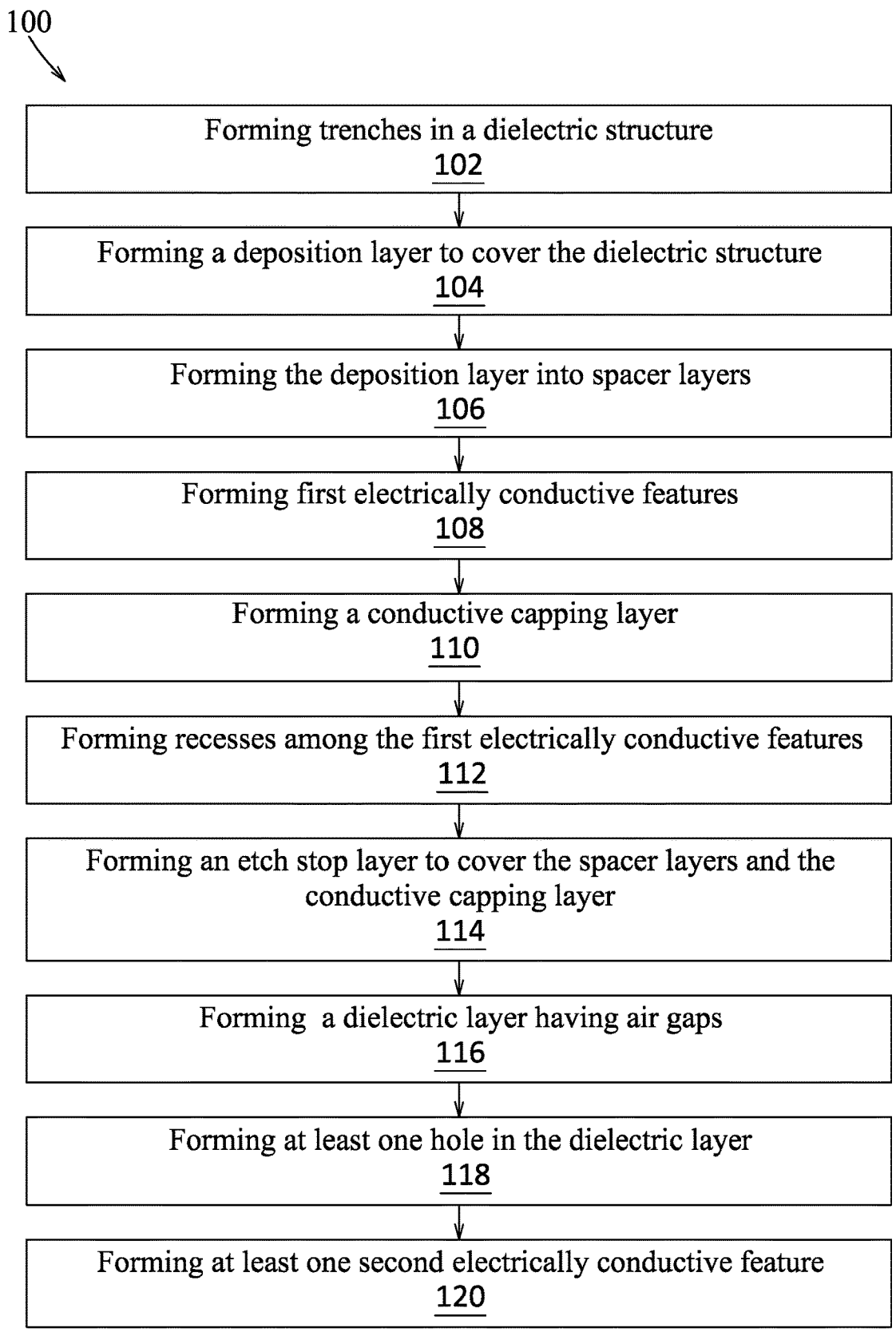
FIG. 1 is a flow diagram illustrating a method for manufacturing a semiconductor structure having air gaps in accordance with some embodiments.

The following disclosure provides many different embodiments, or examples, for implementing different features of the invention. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "on," "above," "over," "downwardly" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

FIG. 1 illustrates a single damascene method 100 for manufacturing a semiconductor structure having air gaps in accordance with some embodiments. FIGS. 2 to 12 illustrate schematic views of a semiconductor structure 200 during various stages of the single damascene method 100 of FIG. 1. The single damascene method 100 and the semiconductor structure 200 are collectively described below. However, additional steps can be provided before, after or during the single damascene method 100, and some of the steps described herein may be replaced by other steps or be eliminated. Similarly, further additional features may be present in the semiconductor structure 200, and/or features present may be replaced or eliminated in additional embodiments.

Referring to FIG. 1, the single damascene method 100 begins at block 102, where trenches are formed in a dielectric structure. Referring to the example illustrated in FIGS. 2 and 3, a dielectric structure 30 formed with trenches 307 is prepared on an interconnect structure 20 disposed over a substrate 10. The dielectric structure 30 may be prepared by sequentially depositing a first etch stop layer 301, a first low-k dielectric layer 302, and a dielectric capping layer 303 on the interconnect structure 20, and patterning the dielectric capping layer 303, the first low –k dielectric layer 302, and the first etch stop layer 301 by one or more etching processes (for example, dry etching, wet etching, or a combination thereof) through a pattern opening of a patterned mask layer (not shown). The dielectric structure 30 thus prepared includes a patterned etch stop layer 304 disposed on the interconnect structure 20, a patterned dummy layer 305 disposed on the patterned etch stop layer 304, and a patterned dielectric capping layer 306 disposed on the patterned dummy layer 305. The dielectric structure 30 is formed with a plurality of the trenches 307 extending through the patterned dielectric capping layer 306, the patterned dummy layer 305, and the patterned etch stop layer 304. The trenches 307 are defined by lateral surfaces 308 of the dielectric structure 30.

Materials suitable for forming the first etch stop layer 301 include, for example, silicon, silicon oxide, silicon nitride, silicon carbide, silicon oxycarbide, silicon oxynitride, silicon carbonitride, silicon oxycarbonitride, cobalt, ruthenium, tungsten, titanium nitride, zirconium oxide, aluminum oxide, yttrium oxide, aluminum oxynitride, hafnium oxide, hafnium zirconium oxide, hafnium silicon oxide, hafnium silicon oxynitride, zirconium silicon oxide, hafnium zirconium silicon oxide, hafnium aluminum oxide, hafnium aluminum nitride, zirconium aluminum oxide, ytterbium oxide, tantalum nitride, tantalum silicon nitride, tantalum oxide, tantalum silicon oxide, titanium nitride, titanium silicon nitride, titanium oxide, titanium silicon oxide, and combinations thereof, but are not limited thereto. The deposition of the first etch stop layer 301 on the interconnect structure 20 may be implemented by a suitable deposition process as is known to those skilled in the art of semiconductor fabrication, for example, physical vapor deposition (PVD), chemical vapor deposition (CVD), plasma-enhanced chemical vapor deposition (PECVD), atomic layer deposition (ALD), plasma-enhanced atomic layer deposition (PEALD), etc., or combinations thereof, but not limited thereto. The first etch stop layer 301 may have a thickness ranging from 1 Å to 100 Å.

Materials suitable for forming the first low-k dielectric layer 302 include silicon oxide, silicon oxycarbide, silicon oxynitride, silicon oxycarbonitride, and combinations thereof, but are not limited thereto, and have a k-value ranging from 1.0 to 3.9. The deposition of the first low-k dielectric layer 302 on the first etch stop layer 301 may be implemented by a suitable deposition process as is known to those skilled in the art of semiconductor fabrication, for example, PVD, CVD, PECVD, ALD, PEALD, etc., or combinations thereof, but not limited thereto. The first low-k dielectric layer 302 may have a thickness ranging from 10 Å to 5000 Å. When the first low-k dielectric layer 302 is made of silicon oxycarbide, an amount of carbon present in silicon oxycarbide is up to 50%. The first low-k dielectric layer 302 may be formed of a single layer or multiple layers of the material.

Materials suitable for forming the dielectric capping layer 303 include, for example, silicon, silicon oxide, silicon nitride, silicon carbide, silicon oxycarbide, silicon oxynitride, silicon carbonitride, silicon oxycarbonitride, cobalt, ruthenium, tungsten, titanium nitride, zirconium oxide, aluminum oxide, yttrium oxide, aluminum oxynitride, hafnium oxide, hafnium zirconium oxide, hafnium silicon oxide, hafnium silicon oxynitride, zirconium silicon oxide, hafnium zirconium silicon oxide, hafnium aluminum oxide, hafnium aluminum nitride, zirconium aluminum oxide, ytterbium oxide, tantalum nitride, tantalum silicon nitride, tantalum oxide, tantalum silicon oxide, titanium nitride, titanium silicon nitride, titanium oxide, titanium silicon oxide, and combinations thereof, but are not limited thereto. The deposition of the dielectric capping layer 303 on the first low-k dielectric layer 302 may be implemented by a suitable deposition process as is known to those skilled in the art of semiconductor fabrication, for example, PVD, CVD, PECVD, ALD, PEALD, etc., or combinations thereof, but not limited thereto. The dielectric capping layer 303 may have a thickness ranging from 1 Å to 500 Å.

Figure 2:
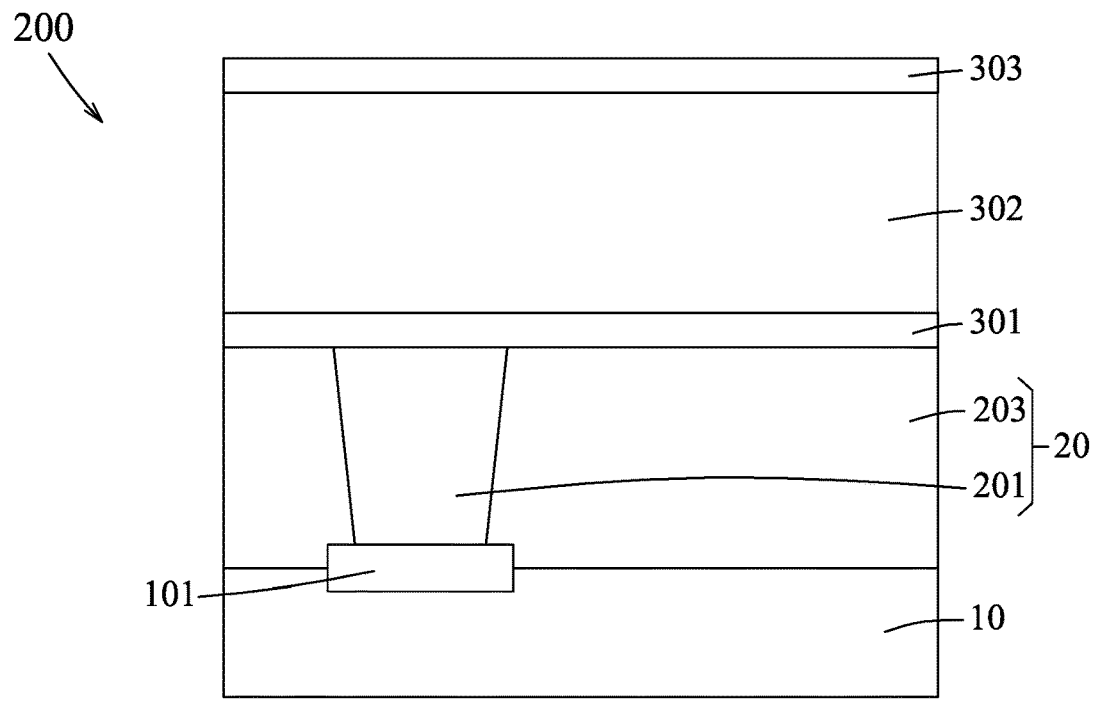
FIGS. 2 to 12 illustrate schematic views showing intermediate stages of the method for manufacturing a semiconductor structure having air gaps as depicted in FIG. 1.
Figure 3:
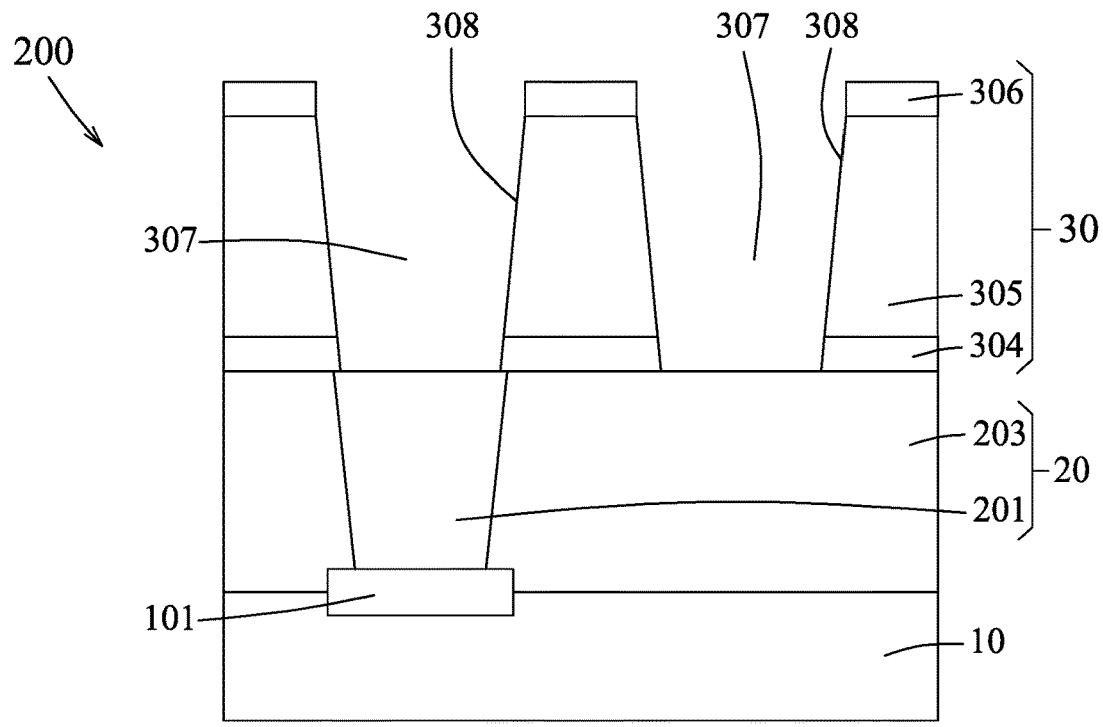

In some embodiments, the substrate 10 may be a semiconductor substrate, e.g., an elemental semiconductor or a compound semiconductor. An elemental semiconductor is composed of single species of atoms, such as silicon (Si) or germanium (Ge) in column IV of the periodic table. A compound semiconductor is composed of two or more elements, such as silicon carbide (SiC), gallium arsenide (GaAs), gallium phosphide (GaP), indium phosphide (InP), indium arsenide (InAs), indium antimonide (InSb), silicon germanium (SiGe), gallium arsenide phosphide (GaAsP), aluminum indium arsenide (AlInAs), aluminum gallium arsenide (AlGaAs), gallium indium arsenide (GaInAs), gallium indium phosphide (GaInP), gallium indium arsenide phosphide (GaInAsP), or the like. The compound semiconductor may have a gradient feature in which the composition thereof changes from one ratio at one location to another ratio at another location in the compound semiconductor. The compound semiconductor may be formed over a silicon substrate. The compound semiconductor may be strained. In some embodiments, the substrate 10 may include a multilayer compound semiconductor structure. Alternatively, the substrate 10 may include a non-semiconductor material, such as a glass, fused quartz, or calcium fluoride. Furthermore, in some embodiments, the substrate 10 may be a semiconductor on insulator (SOI) (e.g., silicon germanium on insulator (SGOI)). Generally, an SOI substrate includes a layer of a semiconductor material such as epitaxial silicon (Si), germanium (Ge), silicon germanium (SiGe), and combinations thereof. The substrate may be doped with a p-type dopant, such as boron (Br), aluminum (Al), gallium (Ga), or the like, or may alternatively be doped with an n-type dopant, as is known in the art. In some embodiments, the substrate 10 may include a doped epitaxial layer. Shallow trench isolation (STI) regions (not shown) may be formed in the substrate 10 to isolate active regions (one is schematically shown in FIG. 2 with the numeral 101), such as source or drain regions of an integrated circuit device (not shown) in the substrate 10. In some embodiments, the integrated circuit device may include complementary metal-oxide semiconductor (CMOS) transistors, planar or vertical multi-gate transistors (e.g., FinFET devices), gate-all-around (GAA) devices, resistors, capacitors, diodes, transistors (e.g., field-effect transistors (FETs)), interconnections, or the like, based on practical applications. In addition, through-vias (not shown) may be formed to extend into the substrate 10 for electrically connecting features on opposite sides of the substrate 10.

The interconnect structure 20 includes a dielectric layer 203 and at least one interconnect 201 (for example, an electrically conductive via), which is formed in the dielectric layer 203 and which is electrically connected to the active region 101 of the substrate 10. The dielectric layer 203 may be made of a dielectric material, such as silicon oxide, SiOC-based materials (e.g., SiOCH), borophosphosilicate glass (BPSG), undoped silicate glass (USG), fluorinated silicate glass (FSG), high-density plasma (HDP) oxide, fluorine-doped silicon oxide, carbon-doped silicon oxide, porous silicon oxide, porous carbon-doped silicon oxide, organic polymers, or silicone based polymers. In some embodiments, silicon oxide may be formed from tetraethyl orthosilicate (TEOS). The dielectric layer 203 may be formed on the substrate 10 by a suitable deposition process as is known to those skilled in the art of semiconductor fabrication, for example, ALD, CVD, PVD, or combinations thereof.

The method 100 then proceeds to block 104 wherein a deposition layer is formed to cover the dielectric structure. Referring to the example illustrated in FIG. 4, a deposition layer 40 is conformally formed on and covers the dielectric structure 30. The deposition of the deposition layer 40 on the dielectric structure 30 may be implemented by a suitable deposition process as is known to those skilled in the art of semiconductor fabrication, for example, PVD, CVD, PECVD, ALD, PEALD, etc., or combinations thereof, but not limited thereto. Materials suitable for forming the deposition layer 40 include, for example, silicon, silicon oxide, silicon nitride, silicon carbide, silicon oxycarbide, silicon oxynitride, silicon carbonitride, silicon oxycarbonitride, cobalt, ruthenium, tungsten, titanium nitride, zirconium oxide, aluminum oxide, yttrium oxide, aluminum oxynitride, hafnium oxide, hafnium zirconium oxide, hafnium silicon oxide, hafnium silicon oxynitride, zirconium silicon oxide, hafnium zirconium silicon oxide, hafnium aluminum oxide, hafnium aluminum nitride, zirconium aluminum oxide, ytterbium oxide, tantalum nitride, tantalum silicon nitride, tantalum oxide, tantalum silicon oxide, titanium nitride, titanium silicon nitride, titanium oxide, titanium silicon oxide, and combinations thereof, but are not limited thereto. The deposition 40 may have a thickness ranging from 1 Å to 200 Å.

Figure 4:
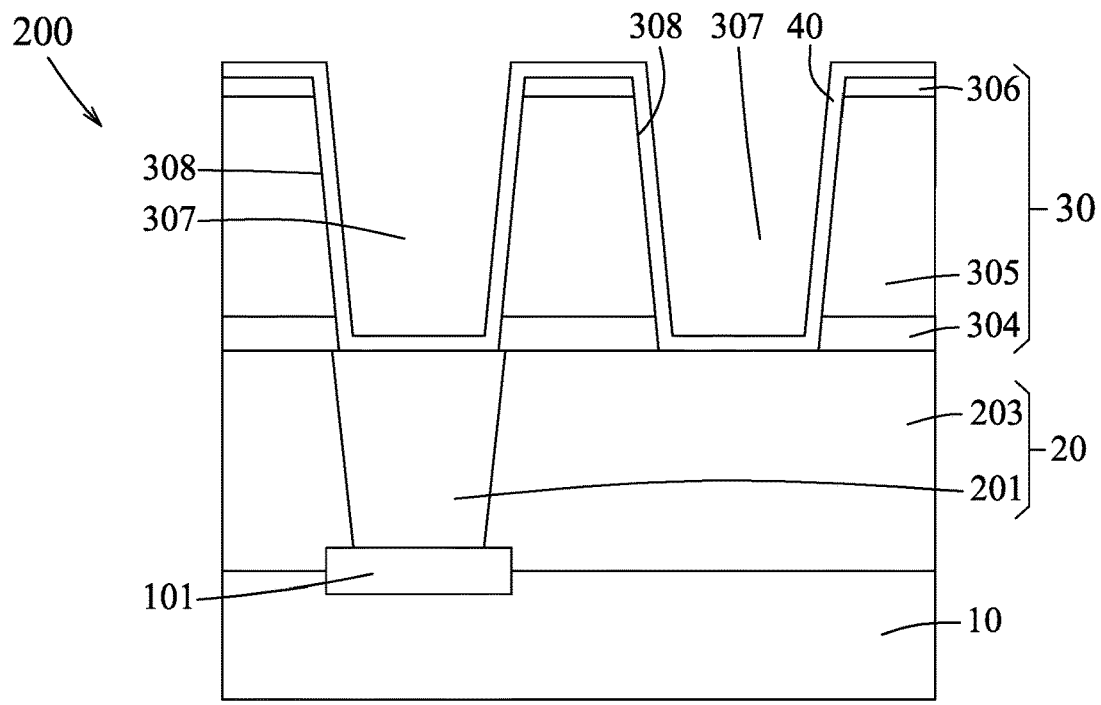
Figure 5:
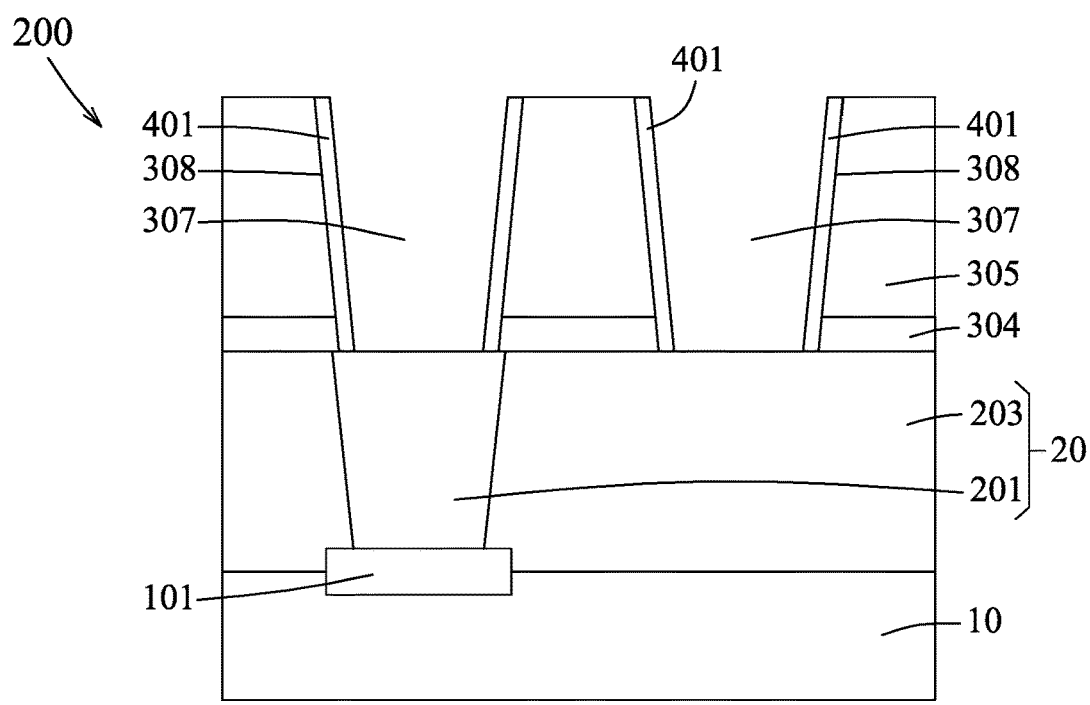
Figure 6:
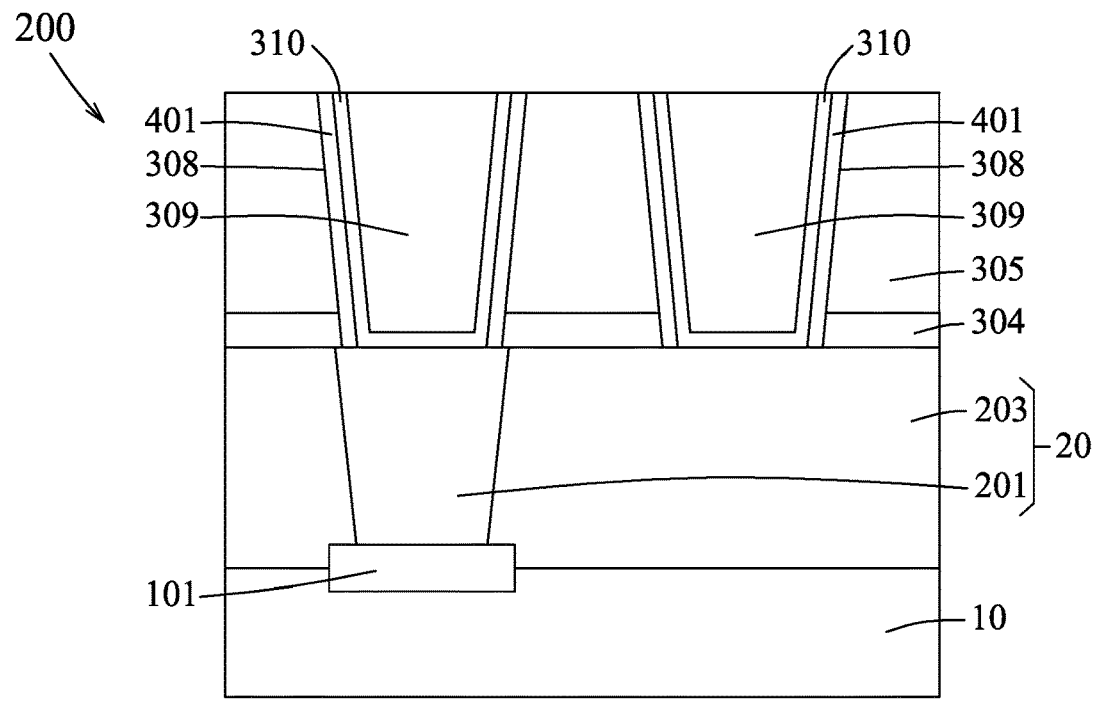
Figure 7:
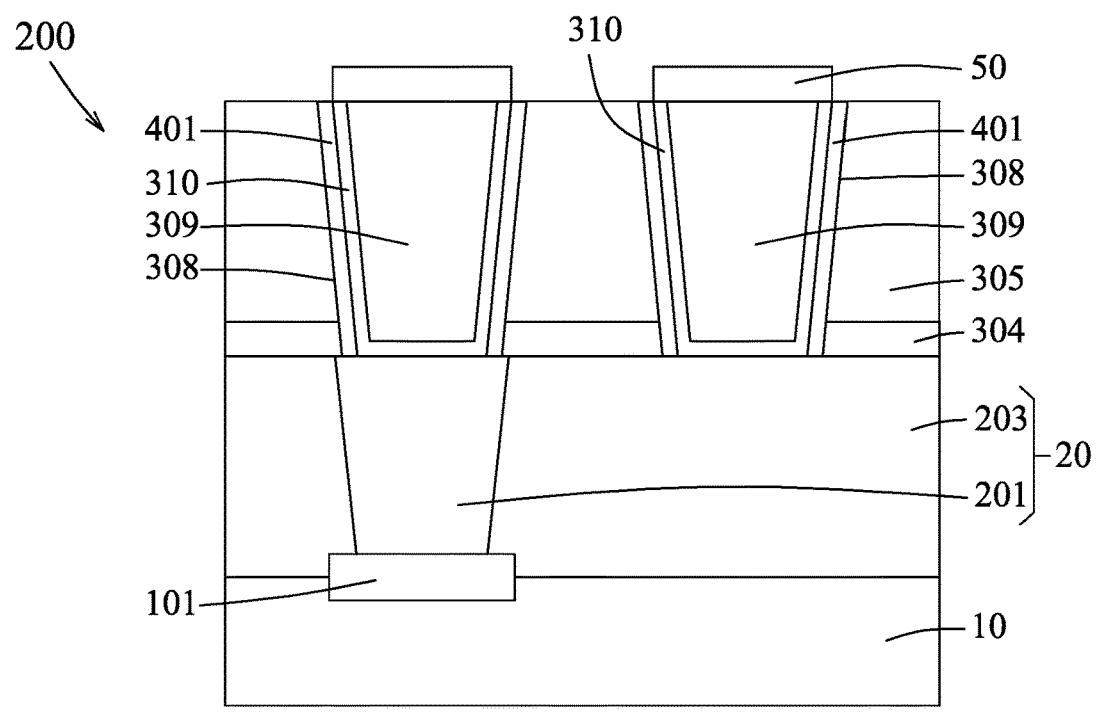
Figure 8:
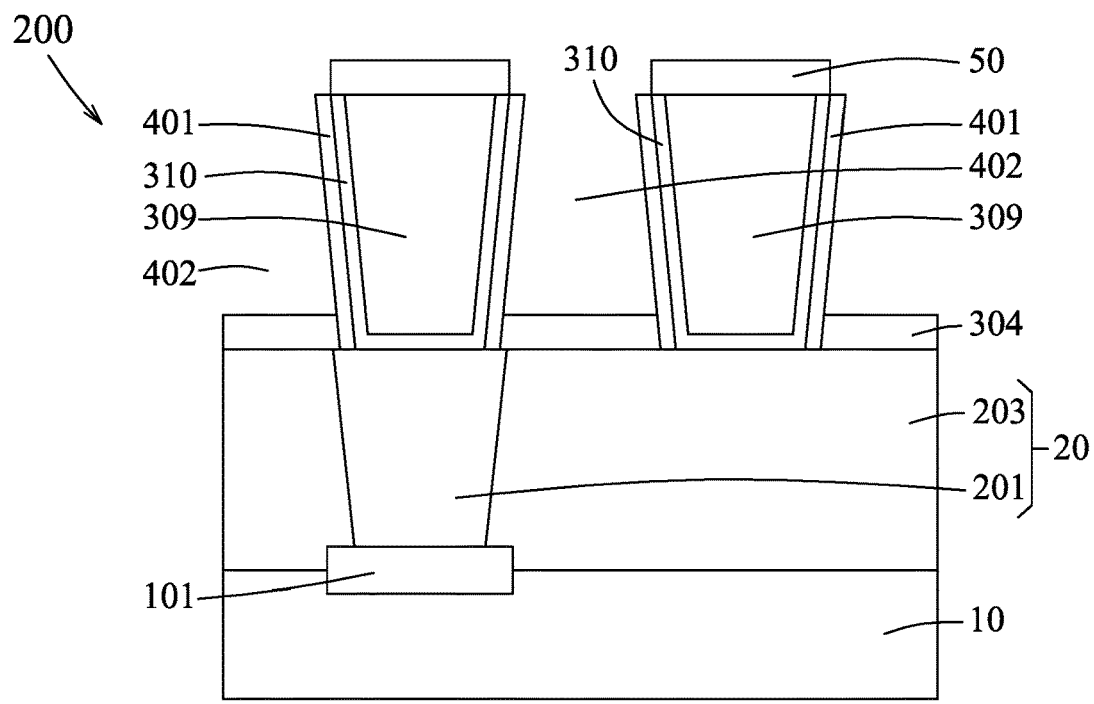
Figure 9:
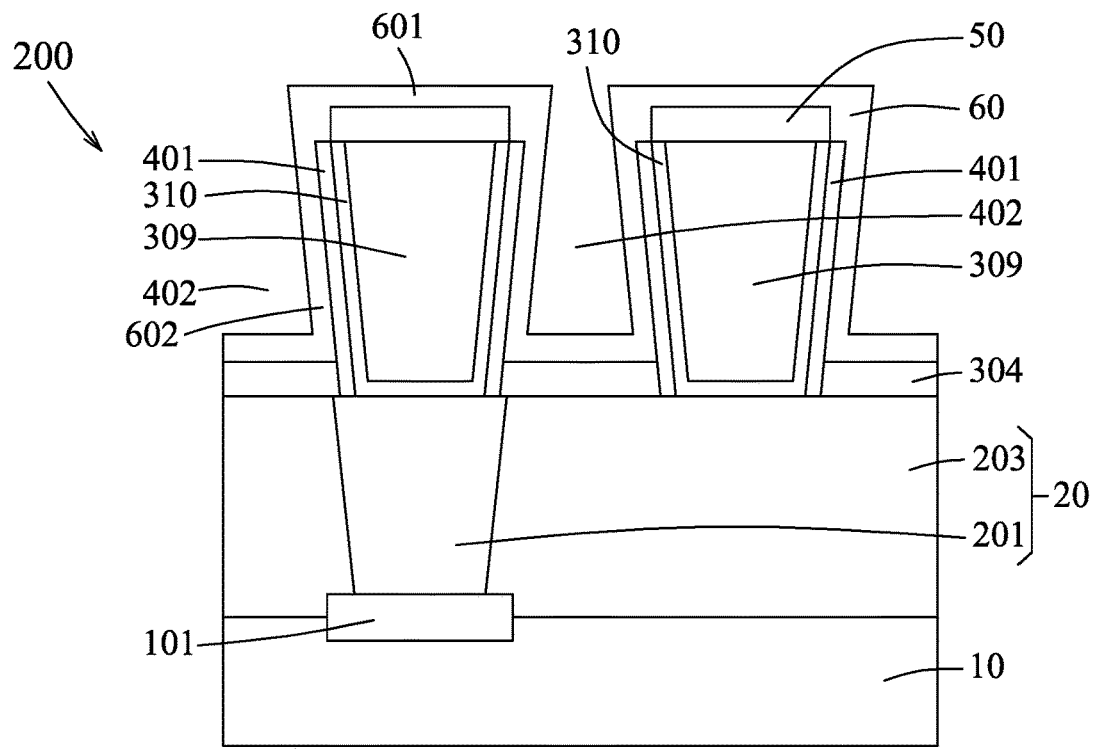
Figure 10:
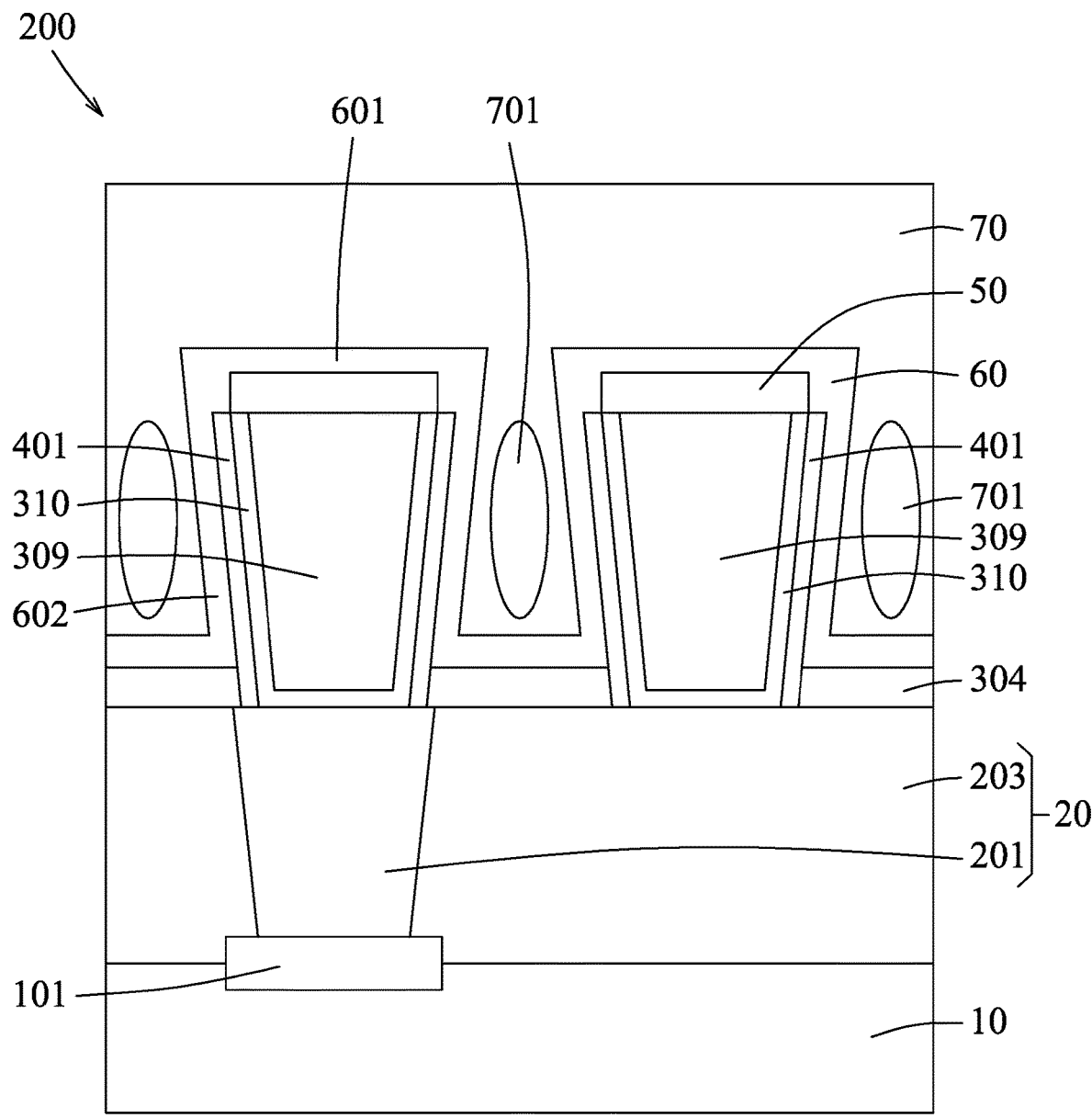
Figure 11:
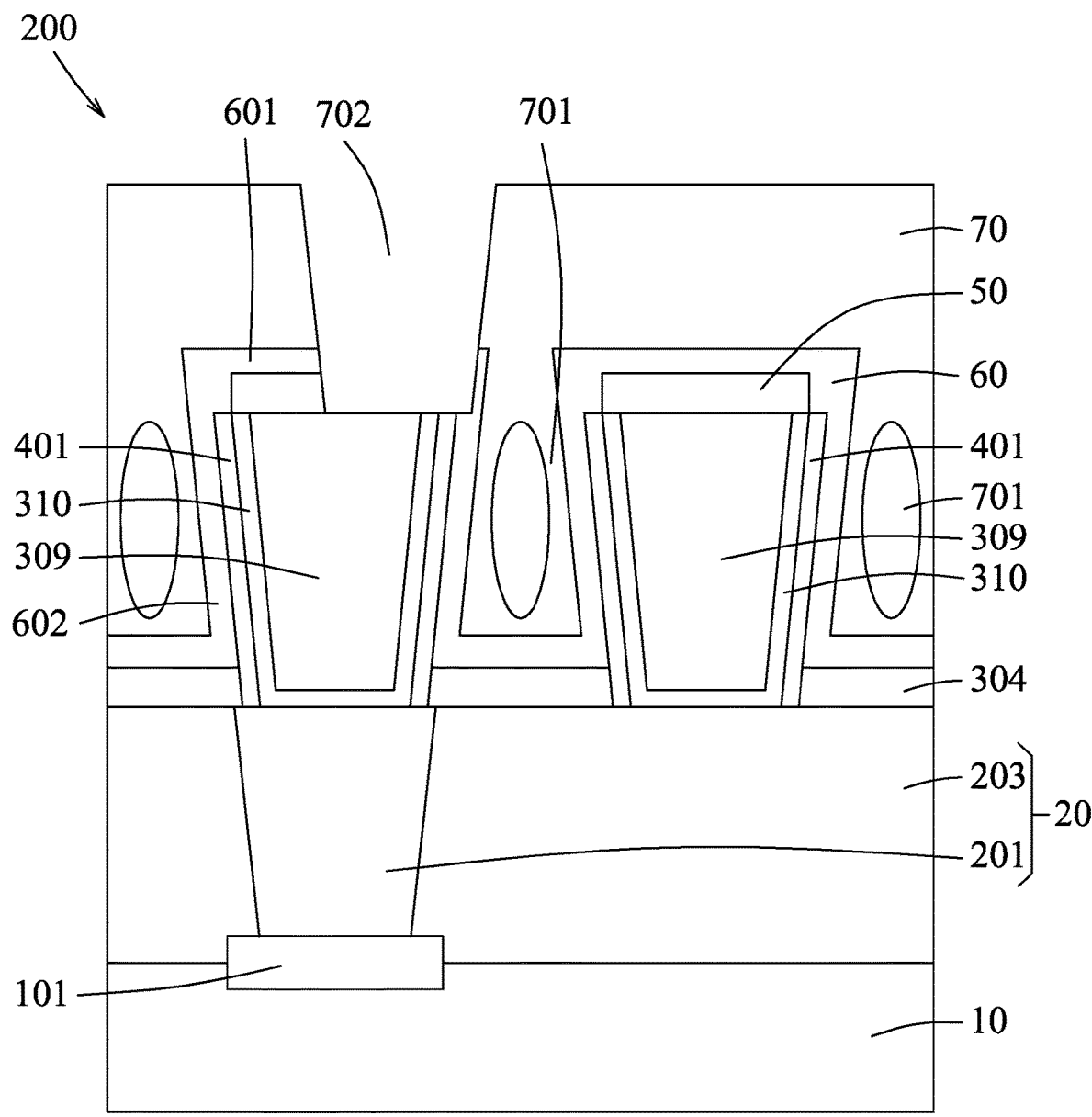
Figure 12:
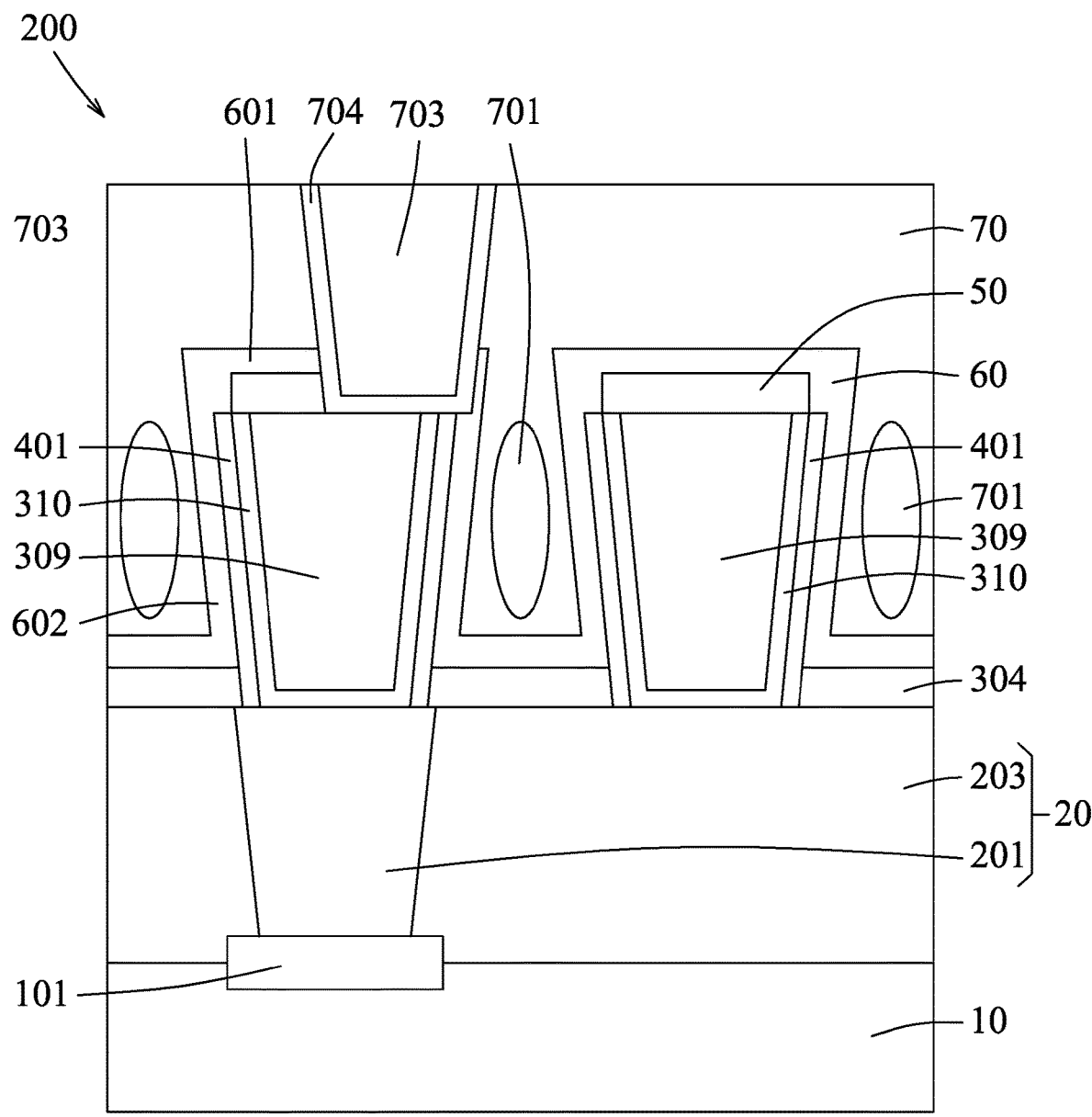
Figure 14:
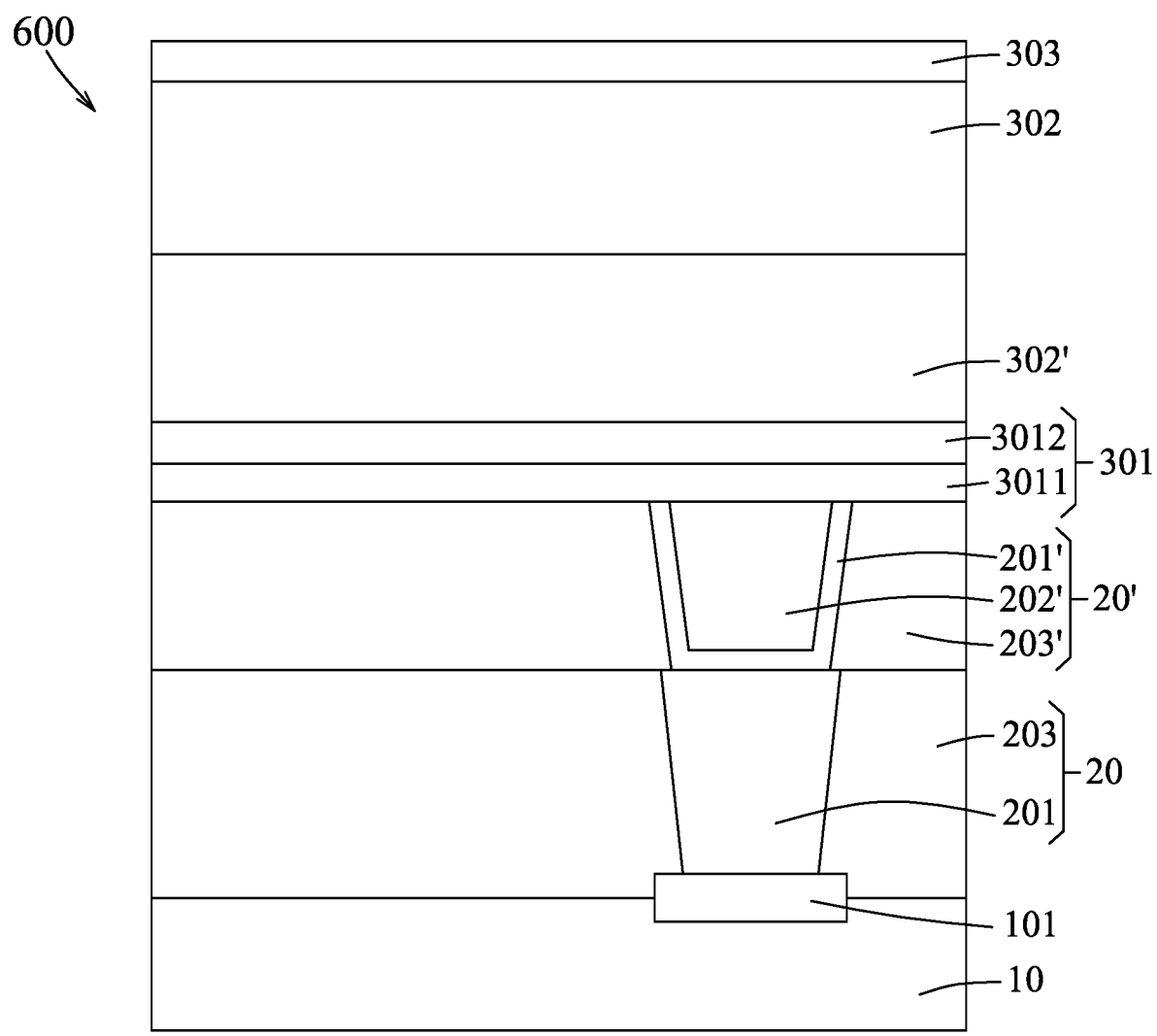
FIGS. 14 to 25 illustrate schematic views showing intermediate stages of the method for manufacturing a semiconductor structure having air gaps as depicted in FIG. 13.
Figure 15:
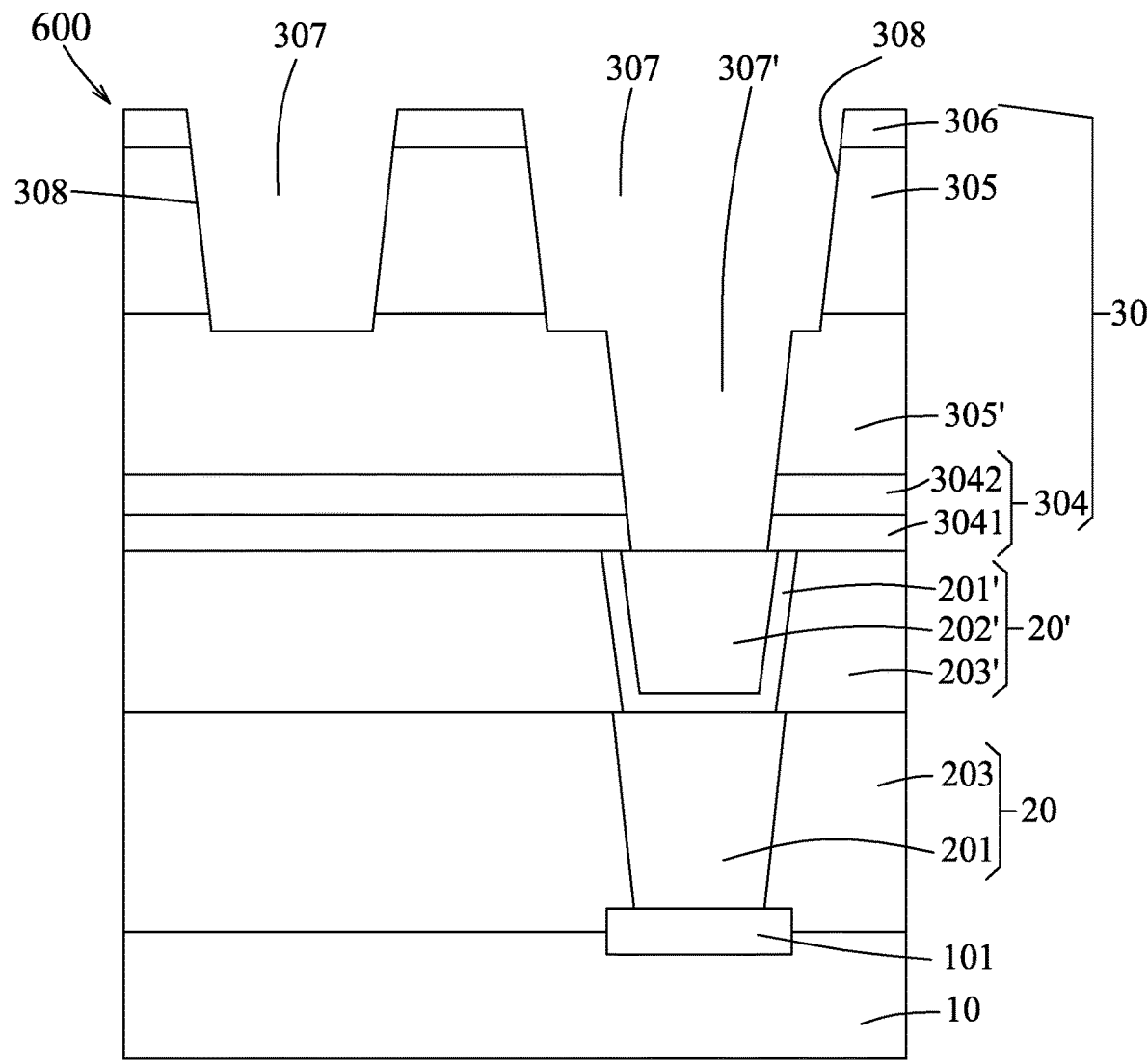

The method 100 then proceeds to block 106 where a plurality of spacer layers are formed. Referring to the example illustrated in FIG. 5, the dielectric structure 30 formed with the deposition layer 40 as shown in FIG. 4 is subjected to anisotropic etching to etch away the patterned dielectric capping layer 306 and the horizontal portions of the deposition layer 40 so as to form the deposition layer 40 into a plurality of spacer layers 401 on the lateral surfaces 308 of the dielectric structure 30 exposed by the trenches 307. In some embodiments, the dielectric capping layer 306 may be partially remained after the anisotropic etching, and may be removed in a subsequent operation. The anisotropic etching may be implemented by a suitable anisotropic etching treatment as is known in the art of semiconductor fabrication, such as dry vertical anisotropic etching, but not limited thereto.

The method 100 then proceeds to block 108 where first electrically conductive features are formed. Referring to the example illustrated in FIGS. 5 and 6, a first electrically conductive material is filled into the trenches 307 to form a plurality of first electrically conductive features 309, such as electrically conductive metal lines.

The first electrically conductive material may be, for example, copper (Cu), aluminum (Al), gold (Au), silver (Ag), tungsten (W), cobalt (Co), ruthenium (Ru), tantalum (Ta), etc., or alloys thereof. The first electrically conductive material may be provided as multiple layers having varying composition, and may be filled into the trenches 307 by a suitable process as is known in the art of semiconductor fabrication, such as electroless plating, electroplating, sputter deposition, or CVD, but not limited thereto.

While the first electrically conductive material may be a suitable metal or alloy thereof as described above, the method of the present disclosure are particularly adapted to the use of Cu. Electroless plating of copper generally includes forming a seed layer followed by autocatalytic copper deposition. Examples of the material for the seed layer include Cu, nickel (Ni), Au, Ag, palladium (Pd), Iridium (Ir), nickel-palladium-gold (NiPdAu), and nickel-gold (NiAu), but not limited thereto. The seed layer can be formed by a suitable process as is known in the art of semiconductor fabrication, such as electroless deposition, sputtering, or CVD, but not limited thereto. Before filling copper or the like into the trenches 307, the trenches 307 may be lined with a barrier layer 310 that prevents electromigration. Examples of materials for the barrier layer 310 include Ru, manganese (Mn), Co, chromium (Cr), titanium nitride (TiN), titanium tungsten (TiW), Ta, tantalum nitride (TaN), tungsten nitride (WN), and combinations thereof. The barrier layer 310 can be deposited by a suitable process, such as CVD or ALD.

A planarization treatment (for example, chemical mechanical planarization (CMP)) is then implemented to remove excess of the first electrically conductive material, so as to permit top surfaces of the first electrically conductive features 309 and the patterned dummy layer 305 to be horizontally flush with each other. It should be noted that if the patterned dielectric capping layer 306 is not removed completely in forming the spacer layers 401, it can be removed by the planarization treatment.

The method 100 then proceeds to block 110 where a conductive material is selectively deposited on the first electrically conductive features to form a conductive capping layer. Referring to the example illustrated in FIG. 7, the first electrically conductive features 309 are then subjected to selective deposition of a conductive material to form a conductive capping layer 50 such that the first electrically conductive features 309 are covered by the conductive capping layer 50 and the spacer layers 401. For example, a self-assembled monolayer (SAM) may be selectively formed on the patterned dummy layer 305 to reduce the deposition rate of the conductive material on the patterned dummy layer 305 to be lower than the deposition rate of the conductive material on the first electrically conductive features 309. In some embodiments, the SAM material includes a head group which contains phosphorus (P), sulfur (S), nitrogen (N), or silicon (Si). In some embodiments, the head group of SAM may include phosphate, sulfate, or silane based materials. In some embodiments, SAM may include benzotriazole (BTA), phosphonic acid, octadecylphosphonic (ODPA), organosulfur compound, thiol (e.g., dodecanethiol, alkanethiol, or the like), or the like. In some embodiments, SAM further includes a tail group which is connected to the head group and which contains an organic chain, such as CHx or the like. Thereafter, the conductive material may be selectively deposited on the first electrically conductive features 309 by a suitable method as is known to those skilled in the art of semiconductor fabrication, such as ALD, CVD, spin-on deposition, etc., or combinations thereof, to form the conductive capping layer 50. In some embodiments, the conductive capping layer 50 may be selectively deposited on the first electrically conductive features 309 directly by ALD, CVD, spin-on deposition, etc. using the controlled operation parameters without the selective formation of SAM in advance. In some embodiments, the conductive capping layer 50 may be selectively deposited on the first electrically conductive features 309 by electroplating.

In some embodiments, after selectively depositing the conductive material on the first electrically conductive features 309, the conductive capping layer 50 may be thermally annealed at a temperature ranging from 30° C. to 500° C. for a time period ranging from 1 second to 300 minutes. When the conductive capping layer 50 is thermally annealed at a temperature greater than 500° C., the electrically conductive features (for example, metal lines) in the semiconductor structure 200 may be damaged. The conductive material suitable for forming the conductive capping layer 50 is a thermally or electrically conductive material, examples of which include conductive carbon-based materials (for example, amorphous carbon, graphene, graphite, etc.), conductive polymers (for example, poly(3,4-ethylenedioxythiophene)-poly(styrene sulfonate) (PEDOT-PSS), polyaniline, etc), conductive organic composites, conductive ceramic composites, conductive metal composites (for example, metals and alloys), and combinations thereof, but are not limited thereto. The conductive capping layer 50 may have a thickness ranging from 1 Å to 100 Å.

The method 100 then proceeds to block 112 where a plurality of recesses are formed among the first electrically conductive features. Referring to the example illustrated in FIGS. 7 and 8, the patterned dummy layer 305 is etched away by a suitable etching method as is known to those skilled in the art of semiconductor fabrication, such as dry plasma etching, wet chemical etching, radical etching, gas etching, vapor etching, or combinations thereof, so as to form a plurality of recesses 402 among the first electrically conductive features 309. The etching chamber tools suitable for implementing the etching method include a capacitively-coupled plasma (CCP) tool, an inductively-coupled plasma (ICP) tool, etc. The wet chemicals suitable for the wet chemical etching include fluorine-containing chemicals (for example, a hydrogen fluoride (HF) solution), amine-containing chemicals (for example, an amine ($NH_3$) solution), etc., but are not limited thereto. The dry plasma gas and gas phase reactants suitable for the etching method include a fluorine-based gas (for example, HF, $CF_4$, $C_4F_8$, etc.), an amine-based gas (for example, $NH_3$), chlorine ($Cl_2$) gas, oxygen ($O_2$) gas, nitrogen ($N_2$) gas, argon (Ar) gas, and combinations thereof, but are not limited thereto. The depths of the recesses 402 can be tuned by, for example, controlling the operation parameters of the etching chamber tools, selecting proper wet chemicals, dry plasma gas, and gas phase reactants, etc. The wet chemicals, the dry plasma gas, and the gas phase reactants for the etching method have an etch selectivity of dielectric to metal ranging from 1 to 600. The depths of the recesses 402 range from 10 Å to 1000 Å. The etch landing of the recesses 402 ranges from 10 Å to 500 Å.

The method 100 then proceeds to block 114 where an etch stop layer is formed to cover the spacer layers, the conductive capping layer, and the patterned etch stop layer. Referring to the example illustrated in FIG. 9, a second etch stop layer 60 is formed in the recesses 402 and over the first electrically conductive features 309, and is conformally deposited to cover the spacer layers 401, the conductive capping layer 50, and the patterned etch stop layer 304. Specifically, the second etch stop layer 60 is conformed in profile to a combined profile of the first electrically conductive features 309, the spacer layers 401, the conductive capping layer 50, and the patterned etch stop layer 304.

Materials suitable for forming the second etch stop layer 60 include, for example, silicon, silicon oxide, silicon nitride, silicon carbide, silicon oxycarbide, silicon oxynitride, silicon carbonitride, silicon oxycarbonitride, cobalt, ruthenium, tungsten, titanium nitride, zirconium oxide, aluminum oxide, yttrium oxide, aluminum oxynitride, hafnium oxide, hafnium zirconium oxide, hafnium silicon oxide, hafnium silicon oxynitride, zirconium silicon oxide, hafnium zirconium silicon oxide, hafnium aluminum oxide, hafnium aluminum nitride, zirconium aluminum oxide, ytterbium oxide, tantalum nitride, tantalum silicon nitride, tantalum oxide, tantalum silicon oxide, titanium nitride, titanium silicon nitride, titanium oxide, titanium silicon oxide, and combinations thereof, but are not limited thereto. The conformal deposition of the second etch stop layer 60 to cover the spacer layers 401, the conductive capping layer 50, and the patterned etch stop layer 304 may be implemented by a suitable deposition process as is known to those skilled in the art of semiconductor fabrication, for example, PVD, CVD, PECVD, ALD, PEALD, etc., or combinations thereof, but not limited thereto. The second etch stop layer 60 may have a thickness ranging from 1 Å to 100 Å. The second etch stop layer 60 includes a top portion 601 and a surrounding portion 602. The top portion 601 is disposed over the first electrically conductive features 309 and covers the conductive capping layer 50. The surrounding portion 602 extends downwardly from the top portion 601 to cover the spacer layers 401 and the patterned etch stop layer 304.

The method 100 then proceeds to block 116 where a dielectric layer having air gaps is formed. Referring to the example illustrated in FIGS. 9 and 10, a dielectric material is deposited in the recesses 402 and over the first electrically conductive features 309 (specifically, on the second etch stop layer 60) to form a second low-k dielectric layer 70 which has air gaps 701 among the first electrically conductive features 309.

Examples of the dielectric material suitable for forming the second low-k dielectric layer 70 include silicon oxide, silicon oxycarbide, silicon oxynitride, silicon oxycarbonitride, and combinations thereof, but are not limited thereto, and have a k-value ranging from 1.0 to 3.9, a porosity ranging from 0.1% to 10%, and a hardness ranging from 1 to 10. The deposition of the second low-k dielectric layer 70 on the second etch stop layer 60 may be implemented by a suitable deposition process as is known to those skilled in the art of semiconductor fabrication, for example, PVD, CVD, PECVD, ALD, PEALD, spin-on deposition, etc., or combinations thereof, but not limited thereto. The second low-k dielectric layer 70 may have a thickness ranging from 100 Å to 2000 Å. When the second low-k dielectric layer 70 is made of silicon oxycarbide, an amount of carbon present in silicon oxycarbide is up to 50%.

The method 100 then proceeds to block 118 where at least one hole is formed in the dielectric layer. Referring to the example illustrated in FIG. 11, the second low-k dielectric layer 70, the second etch stop layer 60, and the conductive capping layer 50 are patterned by one or more etching processes (for example, dry etching, wet etching, or a combination thereof) through a pattern opening of a patterned mask layer (now shown) to form at least one hole 702 in the second low-k dielectric layer 70. Specifically, the at least one hole 702 penetrates through the second low-k dielectric layer 70, the top portion 601 of the second etch stop layer 60, and the conductive capping layer 50 such that at least one of the first electrically conductive features 309 is exposed from the at least one hole 702, respectively. Specifically, the hole 702 penetrates through the top portion 601 of the second etch stop layer 60 and is positioned within the top portion 601 of the second etch stop layer 60.

The method 100 then proceeds to block 120 where at least one second electrically conductive feature is formed. Referring to the example illustrated in FIGS. 11 and 12, a second electrically conductive material is filled into the at least one hole 702 to form at least one second electrically conductive feature 703 electrically connected to the at least one of the first electrically conductive features 309, respectively. In patterning the second low-k dielectric layer 70, the top portion 601 of the second etch stop layer 60, and the conductive capping layer 50, the at least one hole 702 penetrates through the top portion 601 of the second etch stop layer 60 and is positioned within the top portion 601 of the second etch stop layer 60, such that the second electrically conductive feature 703 is formed to penetrate through the top portion 601 of the second etch stop layer 60 and to be positioned within the top portion 601 of the second etch stop layer 60.

The second electrically conductive material may be the same as or different from the first electrically conductive material, and may be, for example, Cu, Al, Au, Ag, W, Co, Ru, Ta, etc., or alloys thereof. The second electrically conductive material may be provided as multiple layers having varying composition, and may be filled into the at least one hole 702 by a suitable process as is known in the art of semiconductor fabrication, such as electroless plating, electroplating, sputter deposition, or CVD, but not limited thereto. Details regarding the formation of at least one second electrically conductive feature 703 are the same as or similar to those regarding the formation of the first electrically conductive features 309 described above with reference to FIGS. 5 and 6. In addition, similarly to that described above with reference to FIGS. 5 and 6, before filling copper or the like into the at least one hole 702, the at least one hole 702 may be lined with a barrier layer 704 that prevents electromigration.

The at least one second electrically conductive feature 703 thus formed penetrates through the second low-k dielectric layer 70, the top portion 601 of the second etch stop layer 60, and the conductive capping layer 50, and is electrically connected to the at least one of the first electrically conductive features 309, respectively. Specifically, the at least one second electrically conductive feature 703 penetrates through the top portion 601 of the second etch stop layer 60 and is positioned within the top portion 601 of the second etch stop layer 60.

FIG. 13 illustrates a dual damascene method 500 for manufacturing a semiconductor structure having air gaps in accordance with some embodiments. FIGS. 14 to 25 illustrate schematic views of a semiconductor structure 600 during various stages of the dual damascene method 500 of FIG. 13. The dual damascene method 500 and the semiconductor structure 600 are collectively described below. However, additional steps can be provided before, after or during the single damascene method 500, and some of the steps described herein may be replaced by other steps or be eliminated. Similarly, further additional features may be present in the semiconductor structure 600, and/or features present may be replaced or eliminated in additional embodiments.

Referring to FIG. 13, the dual damascene method 500 begins at block 502, where a plurality of trenches and at least one via opening are formed in a dielectric structure. Referring to the example illustrated in FIGS. 14 and 15, a dielectric structure 30 formed with a plurality of trenches 307 and at least one via opening 307' is prepared on a metal layer 20'. The metal layer 20' is formed on an interconnect structure 20 disposed over a substrate 10, and includes a dielectric layer 203' and at least one metal line 202' formed in the dielectric layer 203'. Details regarding the formation of the at least one metal line 202' are the same as or similar to those regarding the formation of the first electrically conductive features 309 described above with reference to FIGS. 5 and 6. In addition, similarly to that described above with reference to FIGS. 5 and 6, a barrier layer 201' may be formed to prevent electromigration.

The dielectric structure 30 may be prepared by sequentially depositing a first etch stop layer 301, a dielectric base layer 302', a first low-k dielectric layer 302, and a dielectric capping layer 303 on the metal layer 20', and patterning the dielectric capping layer 303, the first low-k dielectric layer 302, the dielectric base layer 302', and the first etch stop layer 301 by one or more etching processes (for example, dry etching, wet etching, or a combination thereof) through a pattern opening of a patterned mask layer (not shown). In some embodiments, the first etch stop layer 301 may include a lower etch stop sub-layer 3011 deposited on the metal layer 20' and an upper etch stop sub-layer 3012 deposited on the lower etch stop sub-layer 3011. The dielectric structure 30 thus prepared includes a patterned etch stop layer 304 disposed on the metal layer 20', a patterned dielectric base layer 305' disposed on the patterned etch stop layer 304, a patterned dummy layer 305 disposed on the patterned dielectric base layer 305', and a patterned dielectric capping layer 306 disposed on the patterned dummy layer 305. In some embodiments, the patterned etch stop layer 304 may include a lower patterned etch stop sub-layer 3041 disposed on the metal layer 20' and an upper patterned etch stop sub-layer 3042 disposed on the lower patterned etch stop sub-layer 3041. The dielectric structure 30 is thus formed with the plurality of trenches 307 and the at least one via opening 307', which are defined by lateral surfaces 308 of the dielectric structure 30. The trenches 307 extend through the patterned dielectric capping layer 306 and the patterned dummy layer 305. The at least one via opening 307' extends through the patterned dielectric base layer 305' and the patterned etch stop layer 304, and is disposed below and spatially communicated with at least one of the trenches 307, respectively.

Materials suitable for forming the lower etch stop sub-layer 3011 and the upper etch stop sub-layer 3012 independently include, for example, silicon, silicon oxide, silicon nitride, silicon carbide, silicon oxycarbide, silicon oxynitride, silicon carbonitride, silicon oxycarbonitride, cobalt, ruthenium, tungsten, titanium nitride, zirconium oxide, aluminum oxide, yttrium oxide, aluminum oxynitride, hafnium oxide, hafnium zirconium oxide, hafnium silicon oxide, hafnium silicon oxynitride, zirconium silicon oxide, hafnium zirconium silicon oxide, hafnium aluminum oxide, hafnium aluminum nitride, zirconium aluminum oxide, ytterbium oxide, tantalum nitride, tantalum silicon nitride, tantalum oxide, tantalum silicon oxide, titanium nitride, titanium silicon nitride, titanium oxide, titanium silicon oxide, and combinations thereof, but are not limited thereto. The deposition of the lower etch stop sub-layer 3011 and the upper etch stop sub-layer 3012 on the metal layer 20' may be implemented by a suitable deposition process as is known to those skilled in the art of semiconductor fabrication, for example, PVD, CVD, PECVD, ALD, PEALD, etc., or combinations thereof, but not limited thereto. The first etch stop layer 301 (i.e., a combination of the lower etch stop sub-layer 3011 and the upper etch stop sub-layer 3012) may have a thickness ranging from 1 Å to 100 Å.

Materials suitable for forming the dielectric base layer 302' include silicon oxide, silicon oxycarbide, silicon oxynitride, silicon oxycarbonitride, and combinations thereof, but are not limited thereto, and have a k-value ranging from 1.0 to 3.9. The deposition of the dielectric base layer 302' on the first etch stop layer 301 may be implemented by a suitable deposition process as is known to those skilled in the art of semiconductor fabrication, for example, PVD, CVD, PECVD, ALD, PEALD, etc., or combinations thereof, but not limited thereto. The dielectric base layer 302' may have a thickness ranging from 10 Å to 5000 Å.

Details regarding the formation of the first low-k dielectric layer 302 are the same as or similar to those regarding the formation of the first low-k dielectric layer 302 described above with reference to FIG. 2.

Details regarding the formation of the dielectric capping layer 303 are the same as or similar to those regarding the formation of the dielectric capping layer 303 described above with reference to FIG. 2.

The method 500 then proceeds to block 504 wherein a deposition layer is conformally formed to cover the dielectric structure. Referring to the example illustrated in FIG. 16, a deposition layer 40 is conformally formed on and covers the dielectric structure 30. Details regarding the formation of the deposition layer 40 are the same as or similar to those regarding the formation of the deposition layer 40 described above with reference to FIG. 4.

Figure 16:
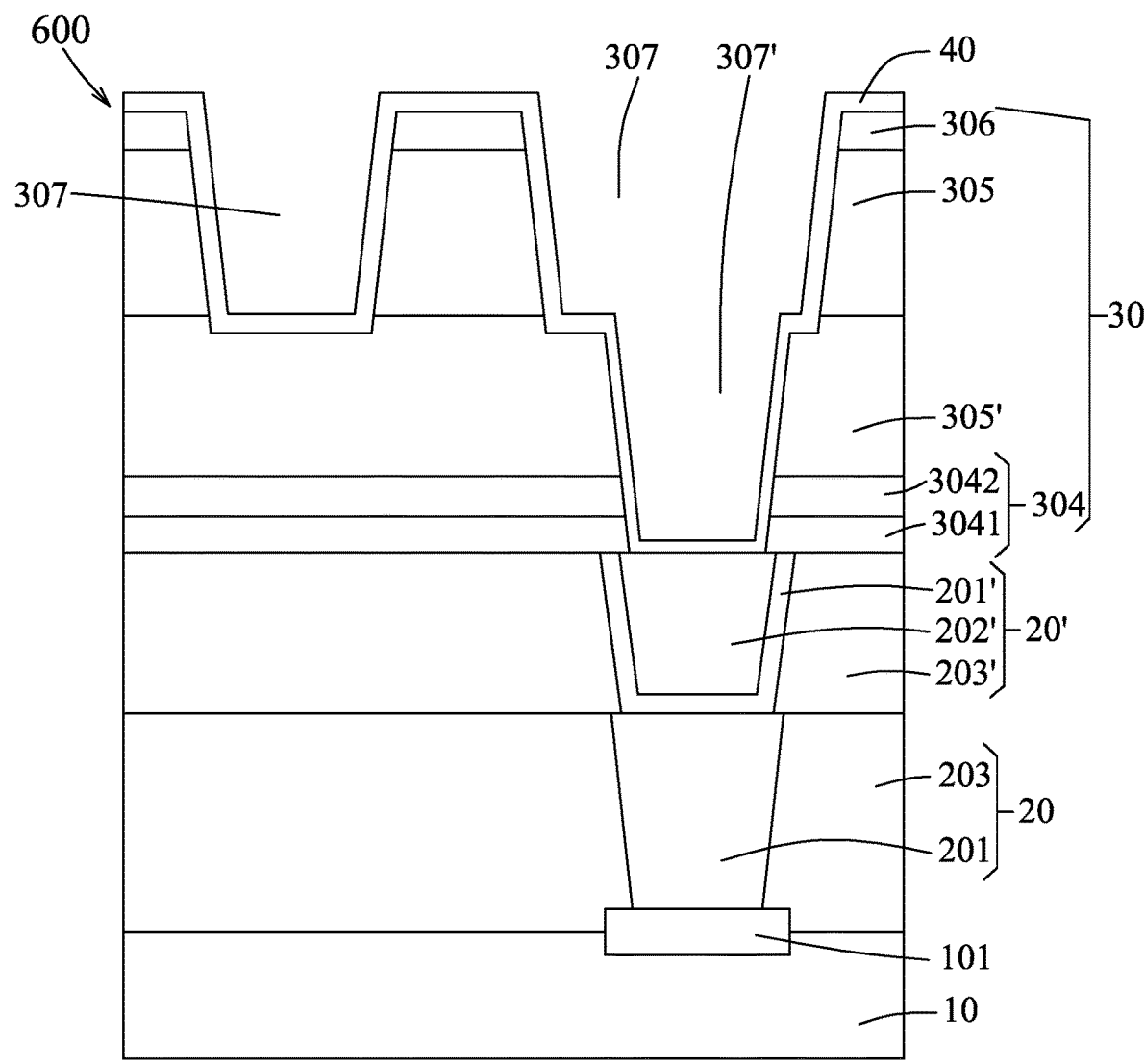
Figure 17:
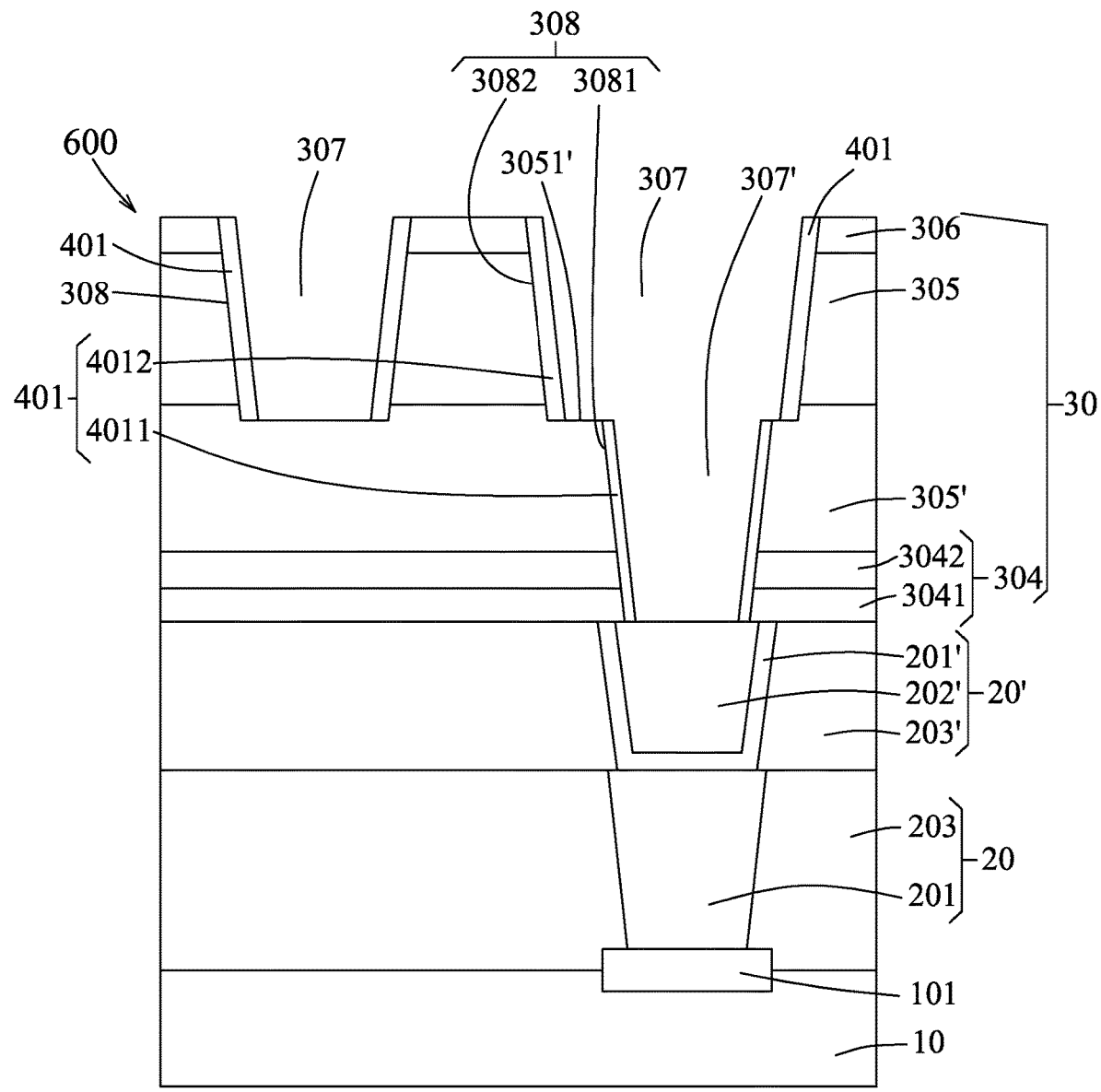

The method 500 then proceeds to block 506 where a plurality of spacer layers are formed. Referring to the example illustrated in FIG. 17, the dielectric structure 30 formed with the deposition layer 40 as shown in FIG. 16 is subjected to anisotropic etching to etch away the horizontal portions of the deposition layer 40 so as to form the deposition layer 40 into a plurality of spacer layers 401 on the lateral surfaces 308 of the dielectric structure 30. Details regarding the formation of the spacer layers 401 are the same as or similar to those regarding the formation of the spacer layers 401 described above with reference to FIGS. 4 and 5.

At least one of the spacer layers 401 includes a lower spacer sub-layer 4011 and an upper spacer sub-layer 4012 separated from the lower spacer sub-layer 4011 by an intermediate surface 3051' of the patterned dielectric base layer 305'. The lower spacer sub-layer 4011 is formed on a lower portion 3081 of a corresponding one of the lateral surfaces 308 exposed by the at least one via opening 307', and the upper spacer sub-layer 4012 is formed on an upper portion 3082 of the corresponding one of the lateral surfaces 308 exposed by a corresponding one of the trenches 307.

It should be noted that the patterned dielectric capping layer 306 may be moved away together with the horizontal portions of the deposition layer 40 by the anisotropic etching.

The method 500 then proceeds to block 508 where first electrically conductive features are formed. Referring to the example illustrated in FIGS. 17 and 18, a first electrically conductive material is filled into the plurality of the trenches 307 and the at least one via opening 307' to form a plurality of first electrically conductive features 309. At least one of the first electrically conductive features 309 includes a lower electrically conductive sub-feature 3091 (i.e., an electrically conductive via) disposed in the dielectric patterned base layer 305' and electrically connected to the at least one metal line 202' of the metal layer 20', and an upper electrically conductive sub-feature 3092 (i.e., a metal line) disposed in the patterned dummy layer 305 and connected to the lower electrically conductive sub-feature 3091.

Details regarding the formation of the first electrically conductive features 309 are the same as or similar to those regarding the formation of the first electrically conductive features 309 described above with reference to FIGS. 5 and 6. In addition, similarly to that described above with reference to FIGS. 5 and 6, before filling copper or the like into the plurality of the trenches 307 and the at least one via opening 307', the plurality of the trenches 307 and the at least one via opening 307' may be lined with a barrier layer 310 that prevents electromigration. The intermediate surface 3051' of the patterned dielectric base layer 305' is in contact with a portion of the barrier layer 301 below the upper electrically conductive sub-feature 3092.

Figure 18:
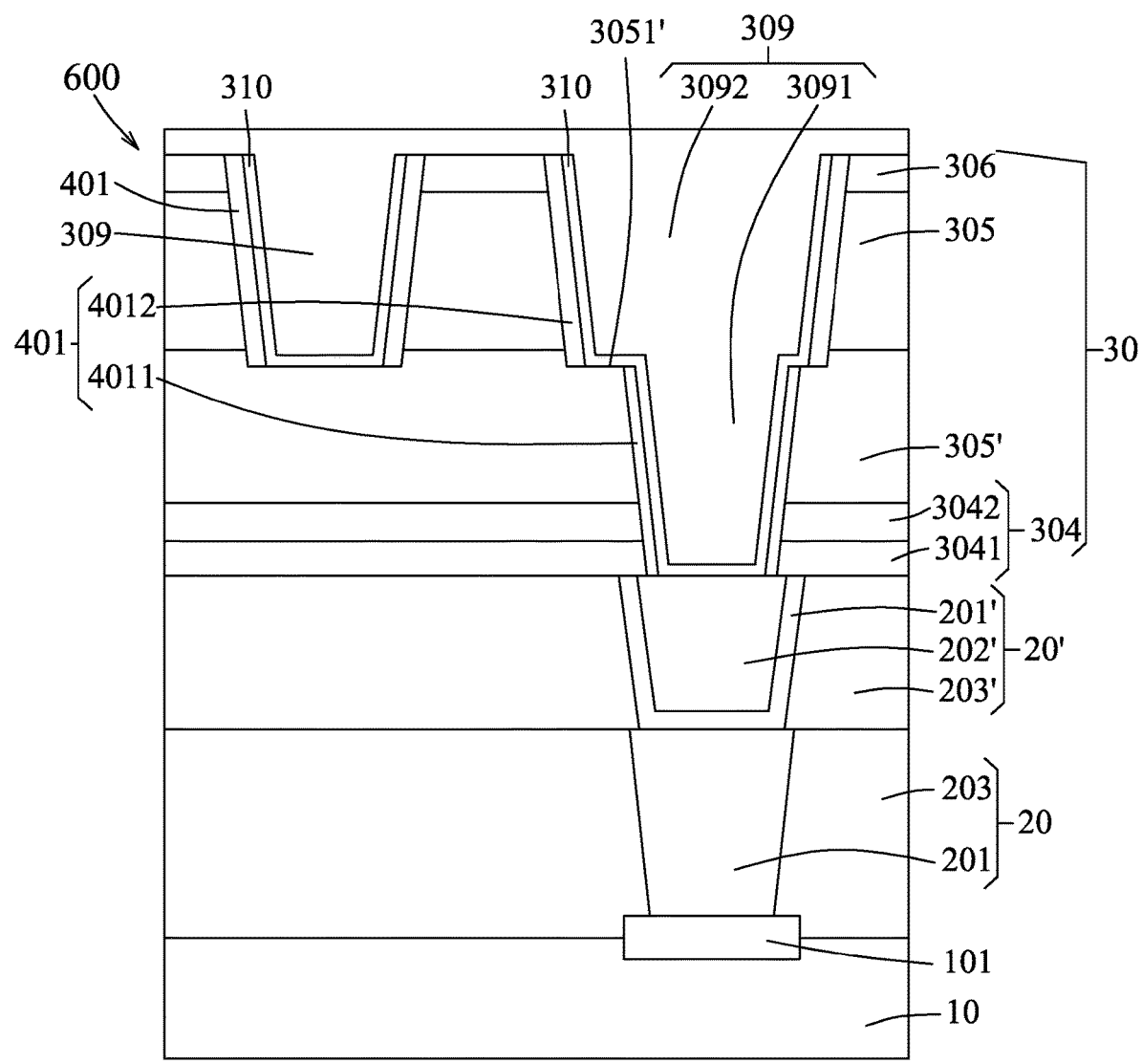
Figure 19:
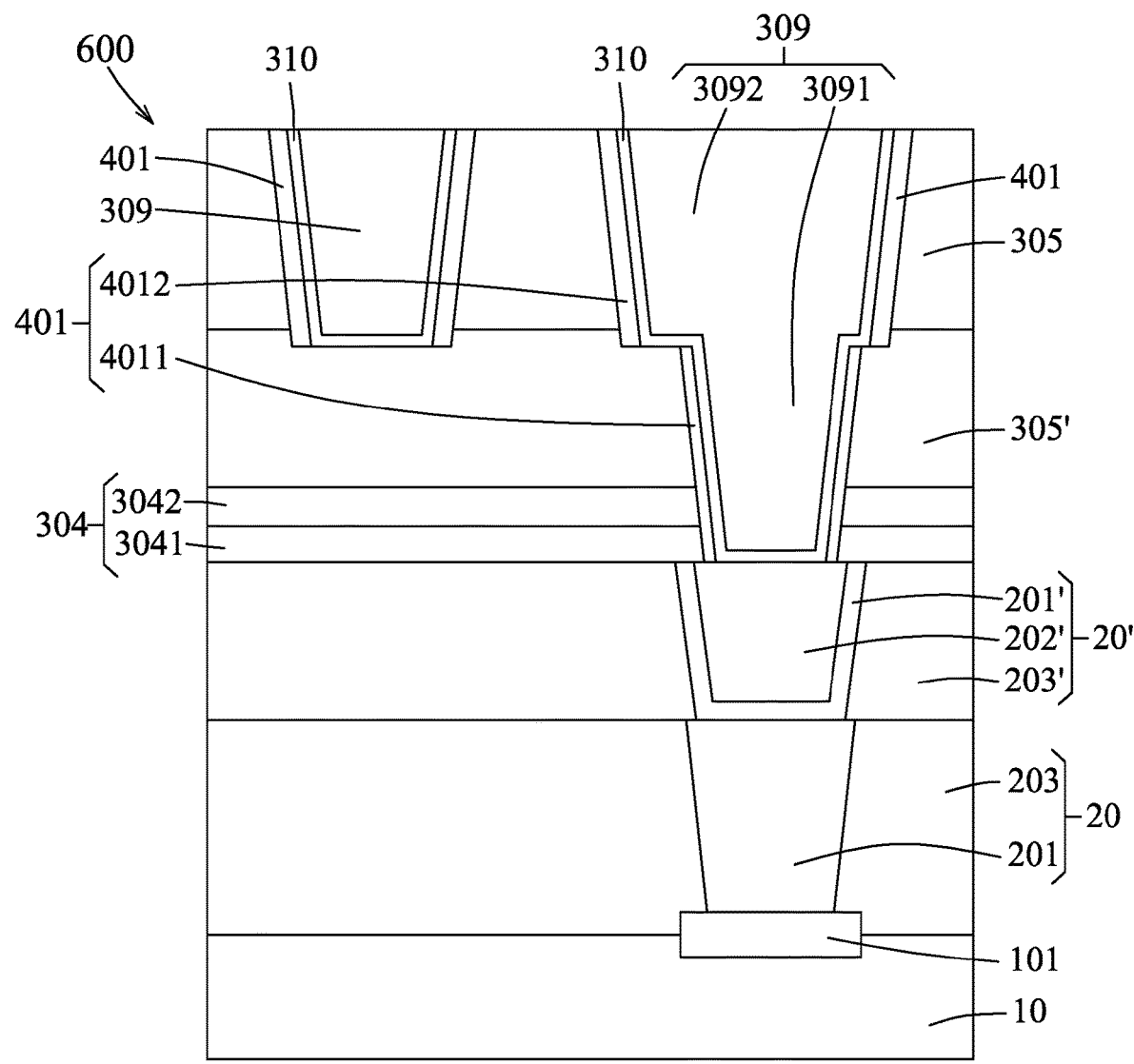
Figure 20:
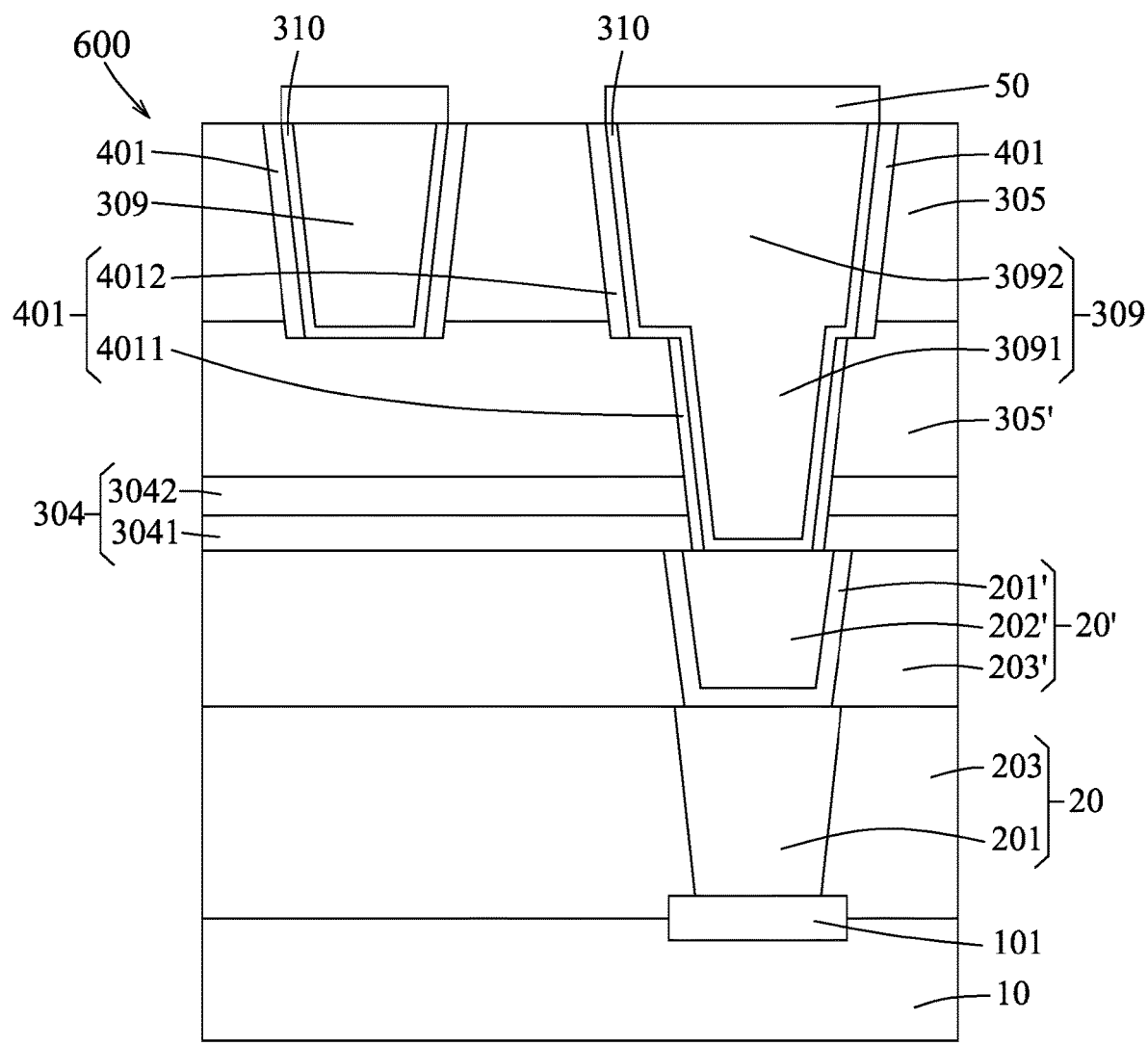
Figure 21:
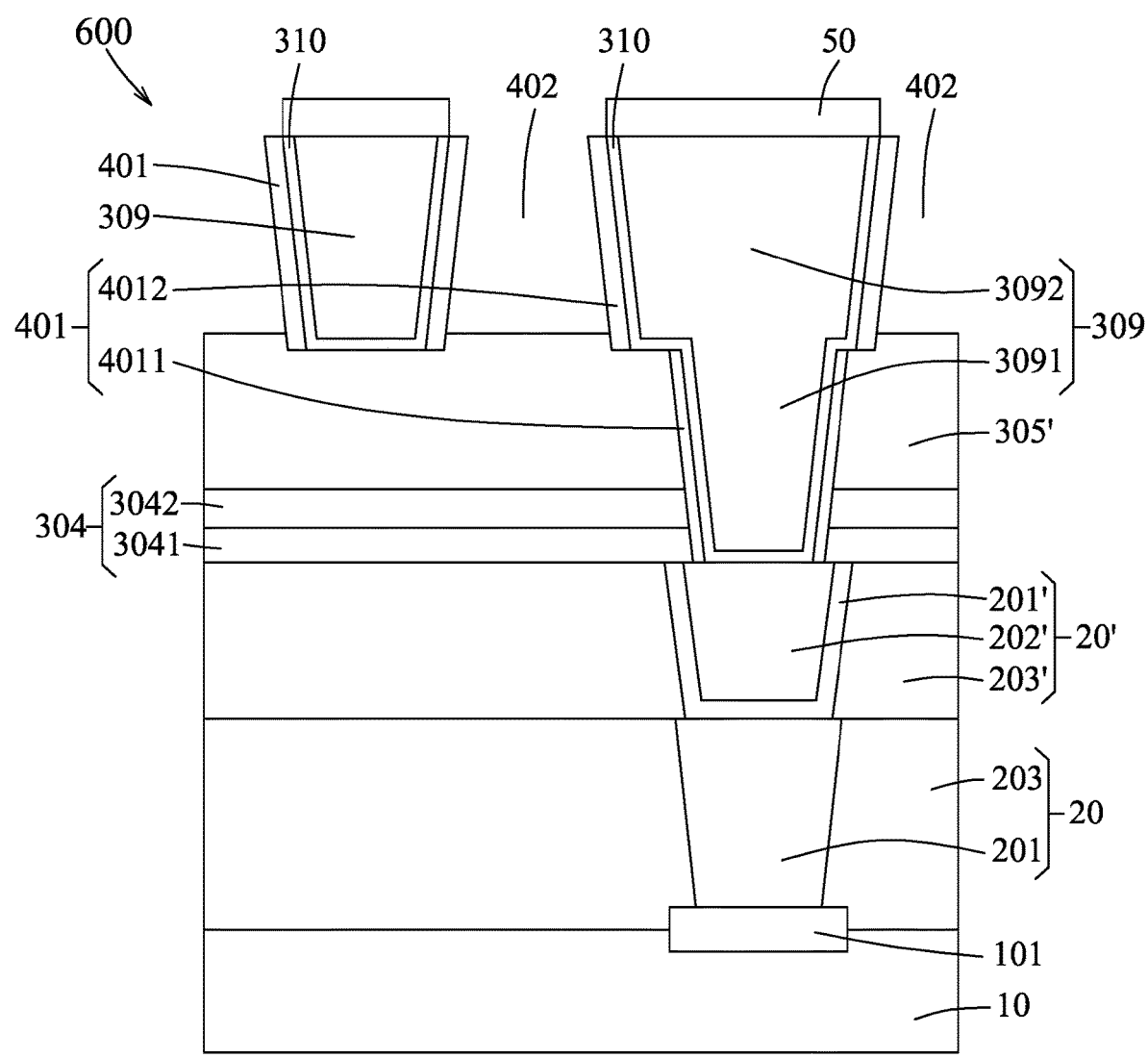
Figure 22:
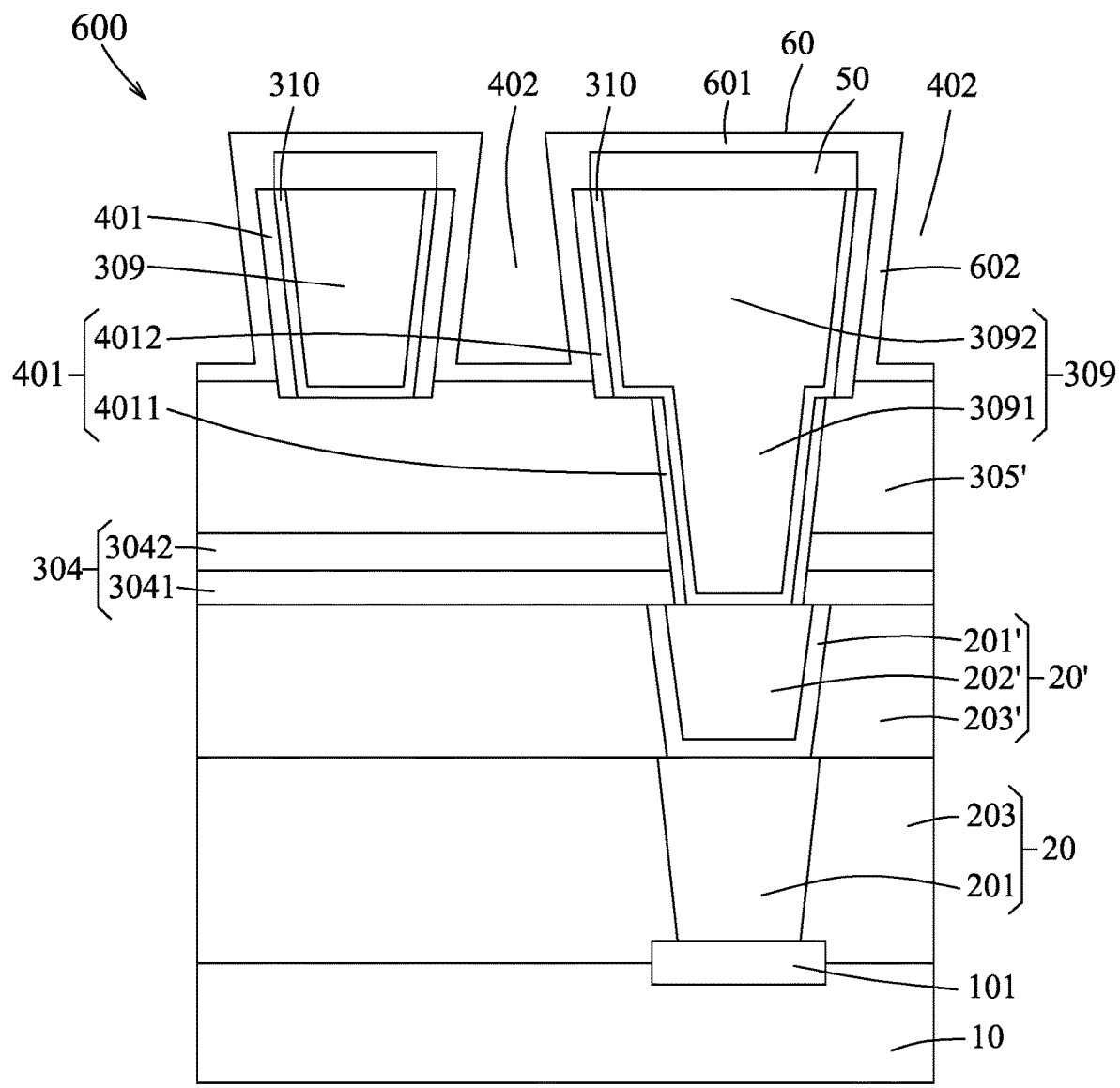
Figure 23:
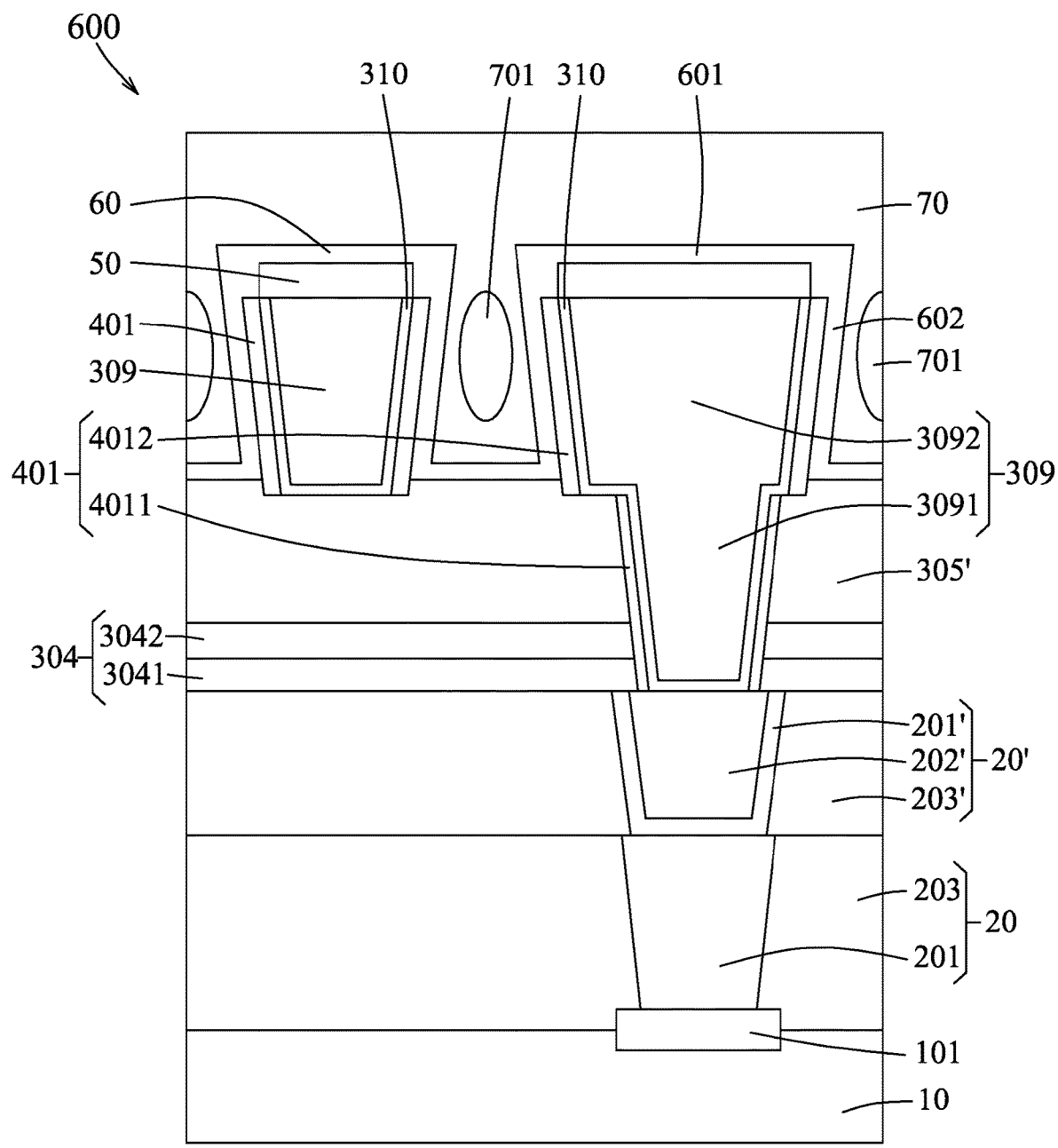
Figure 24:
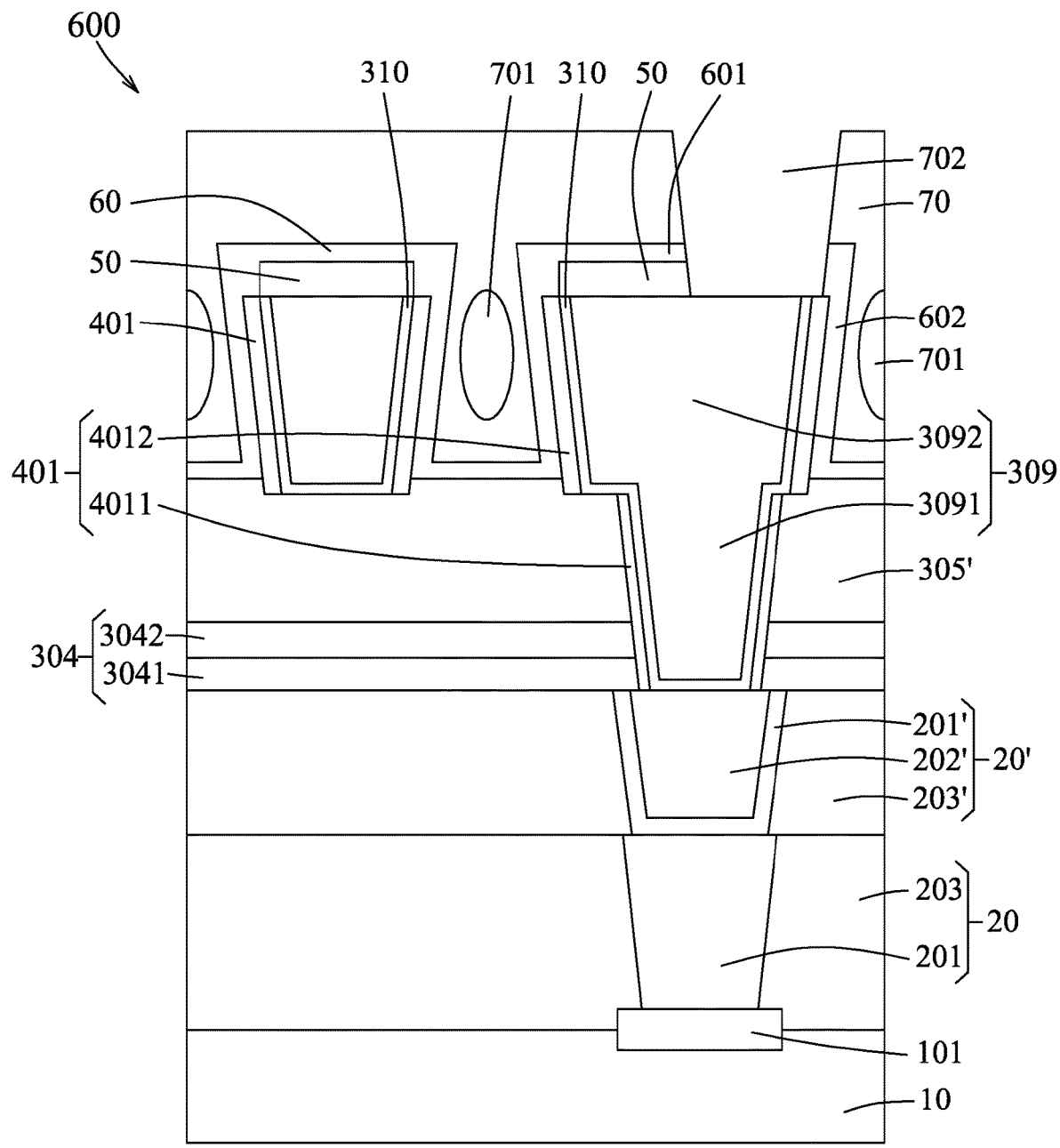
Figure 25:
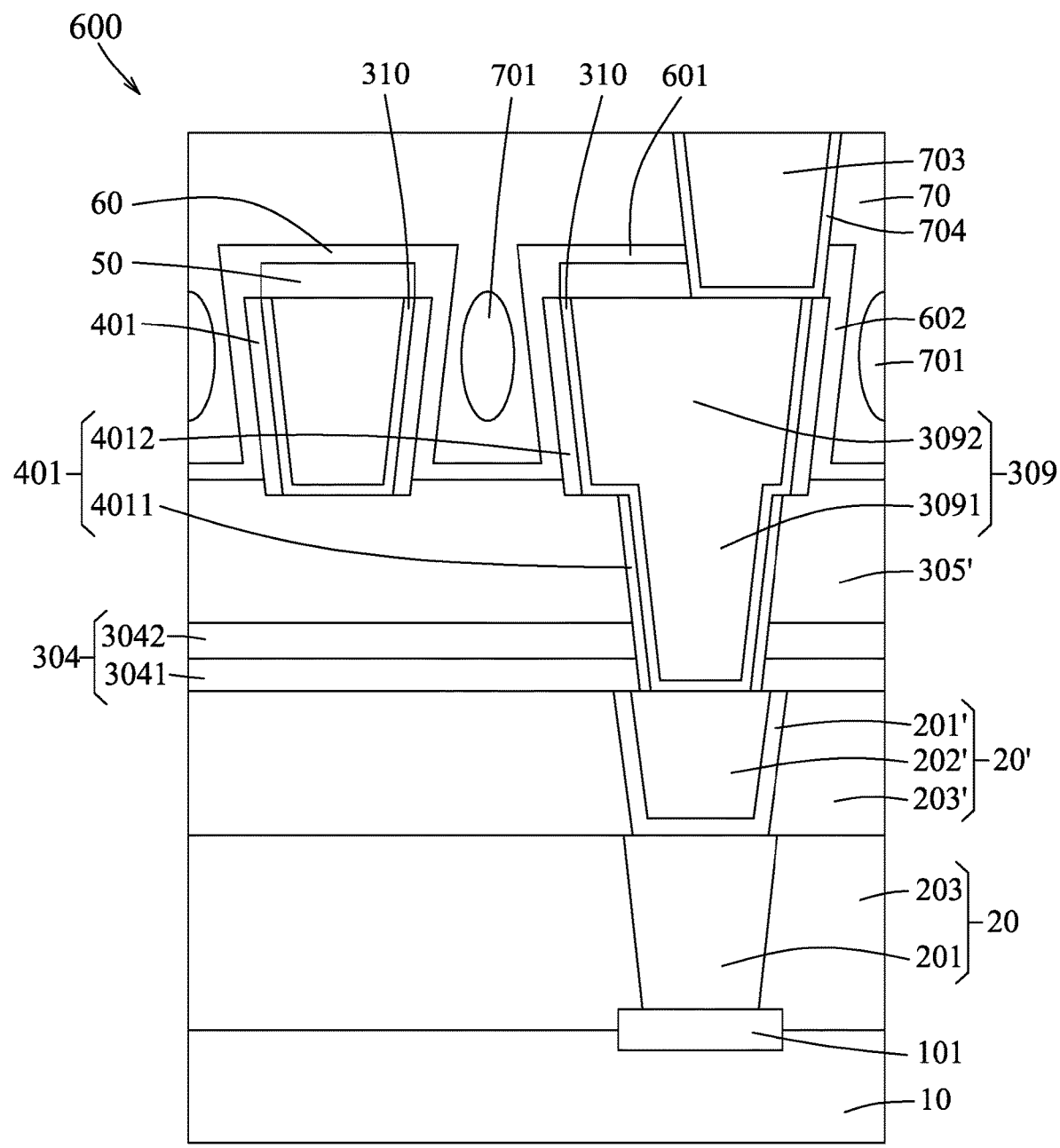
Figure 26:
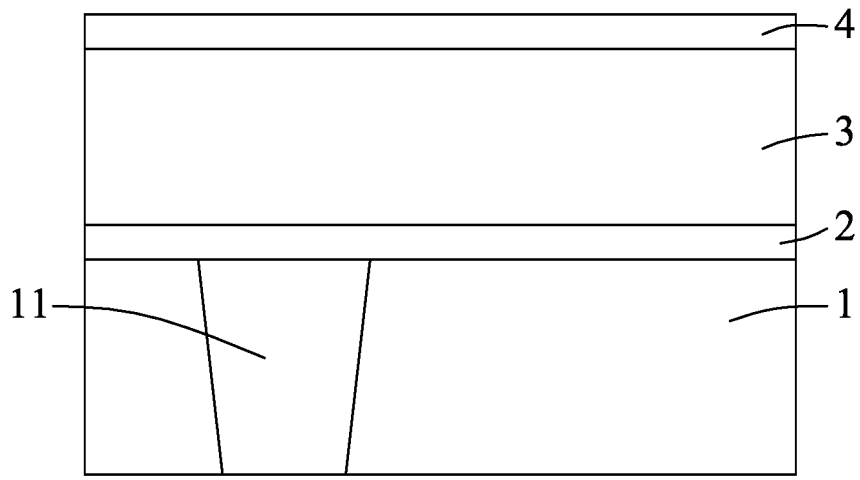
FIGS. 26 to 36 illustrate schematic views showing intermediate stages of a method for manufacturing a semiconductor structure having air gaps.
Figure 27:
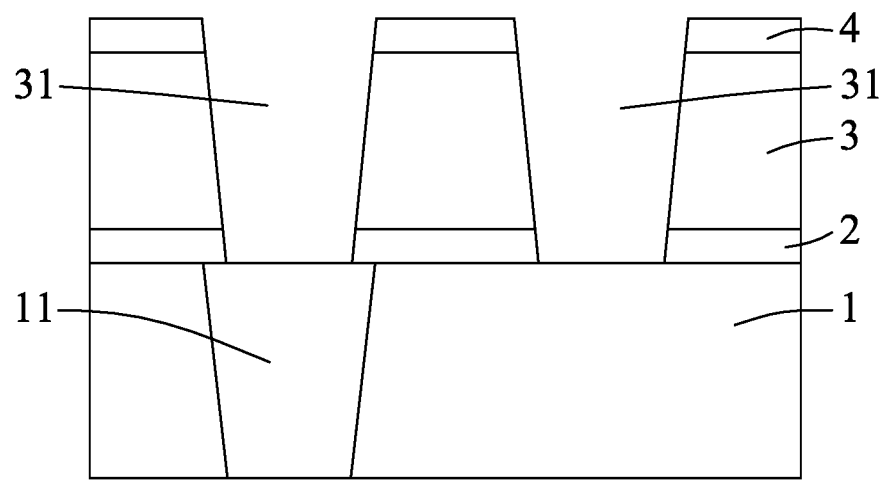
Figure 28:
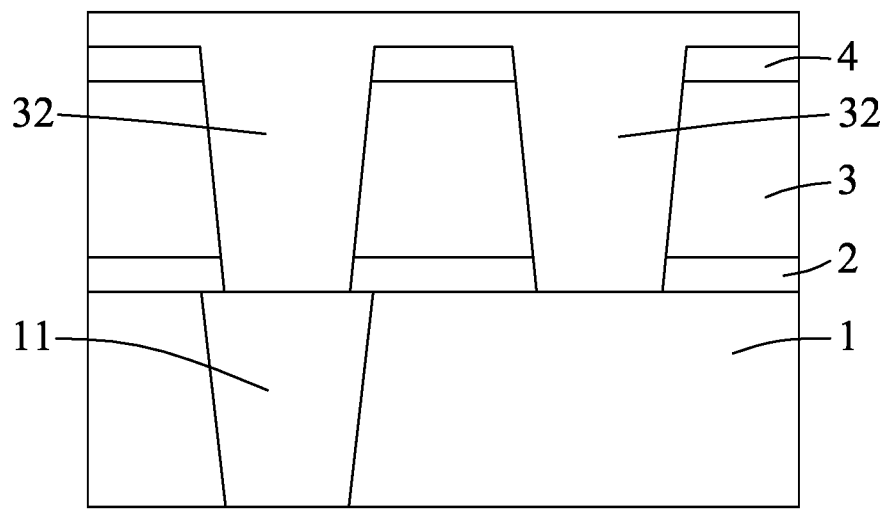
Figure 29:
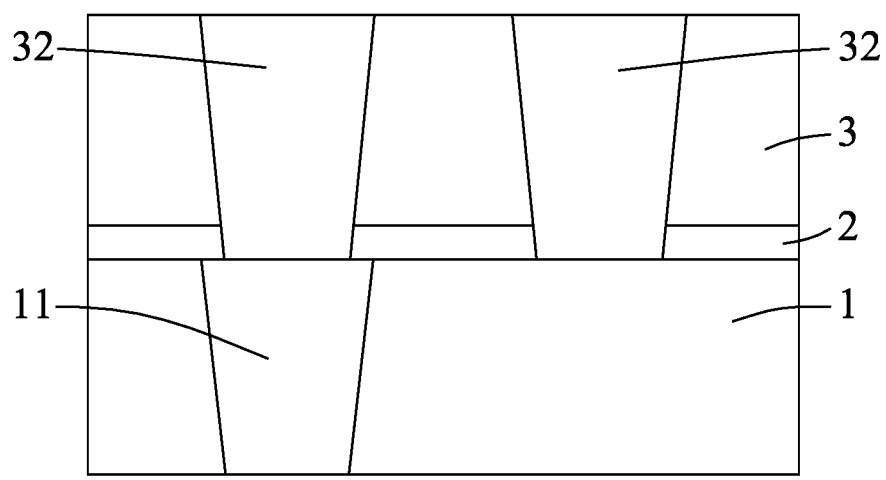
Figure 30:
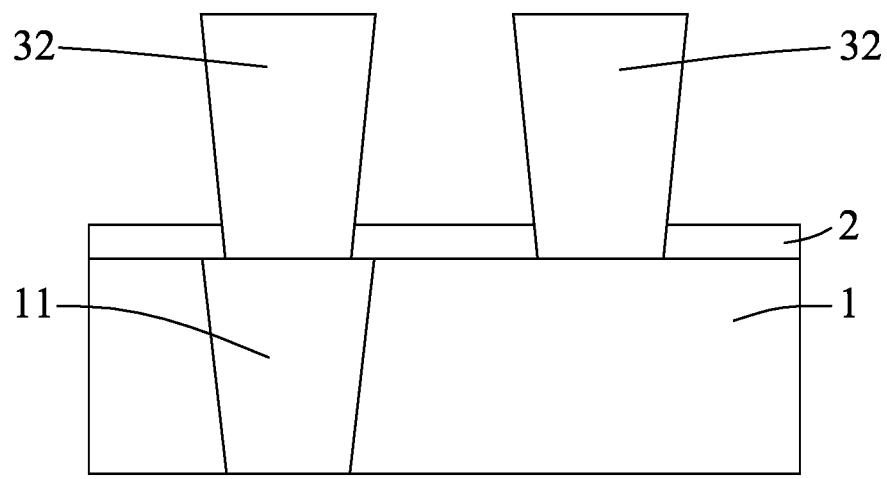
Figure 31:
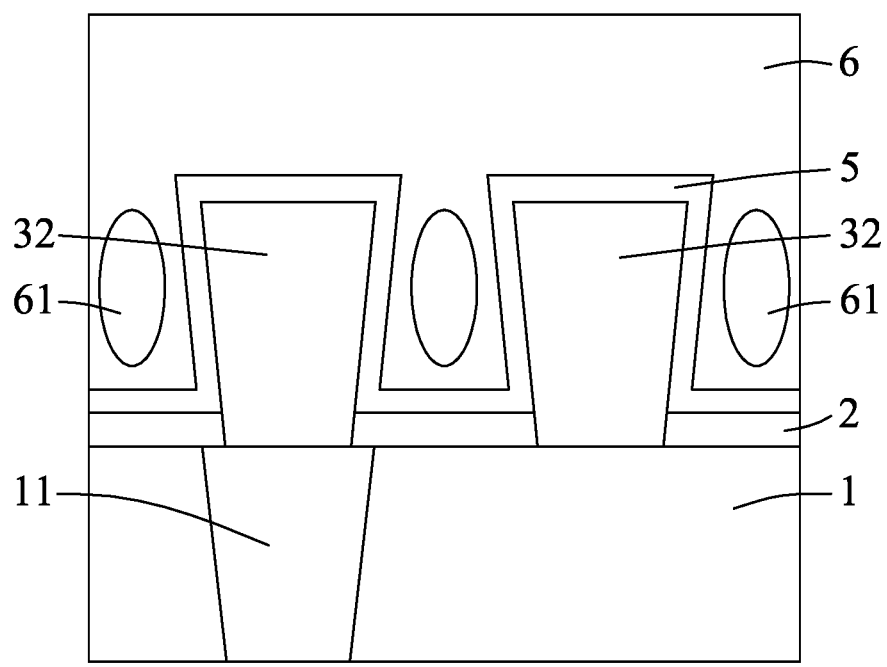
Figure 32:
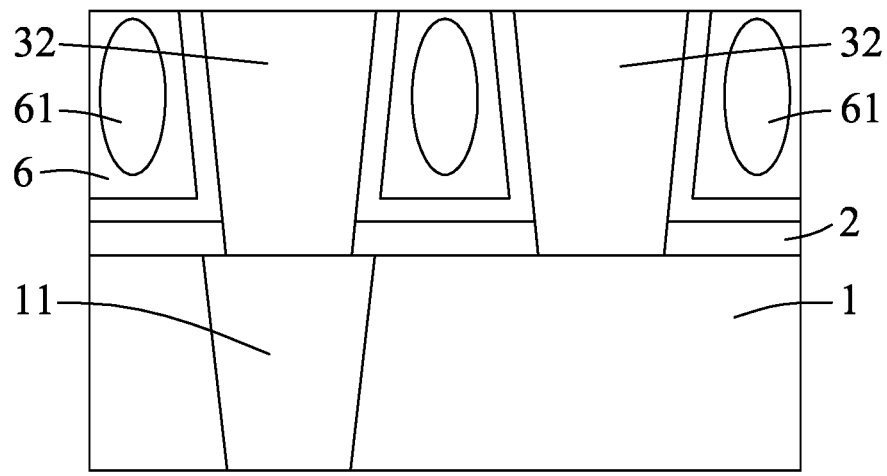
Figure 33:
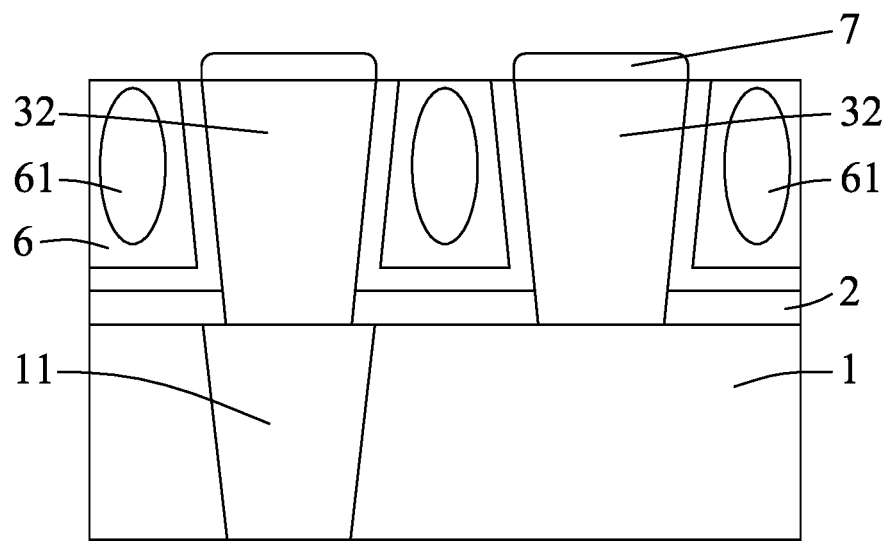
Figure 34:
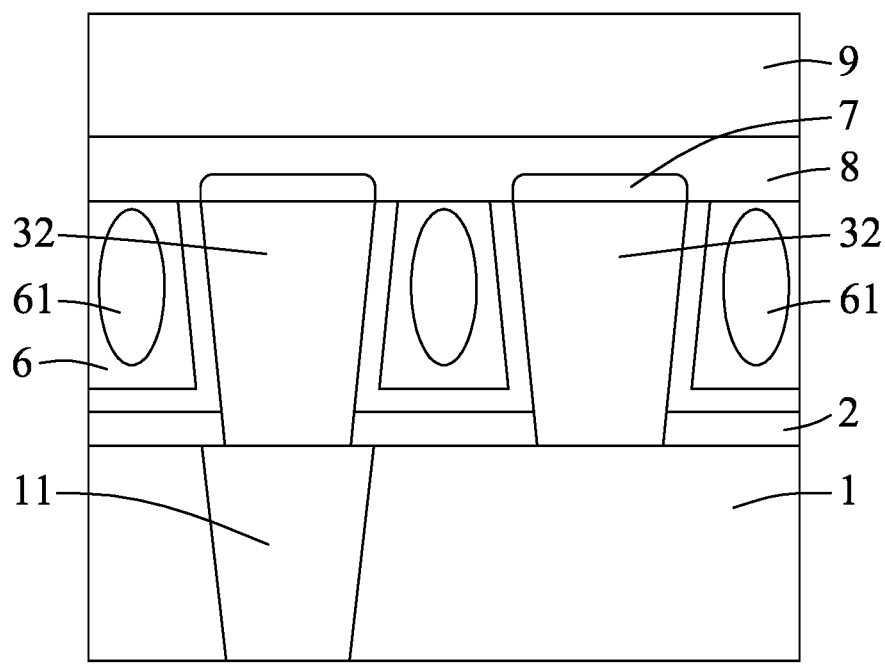
Figure 35:
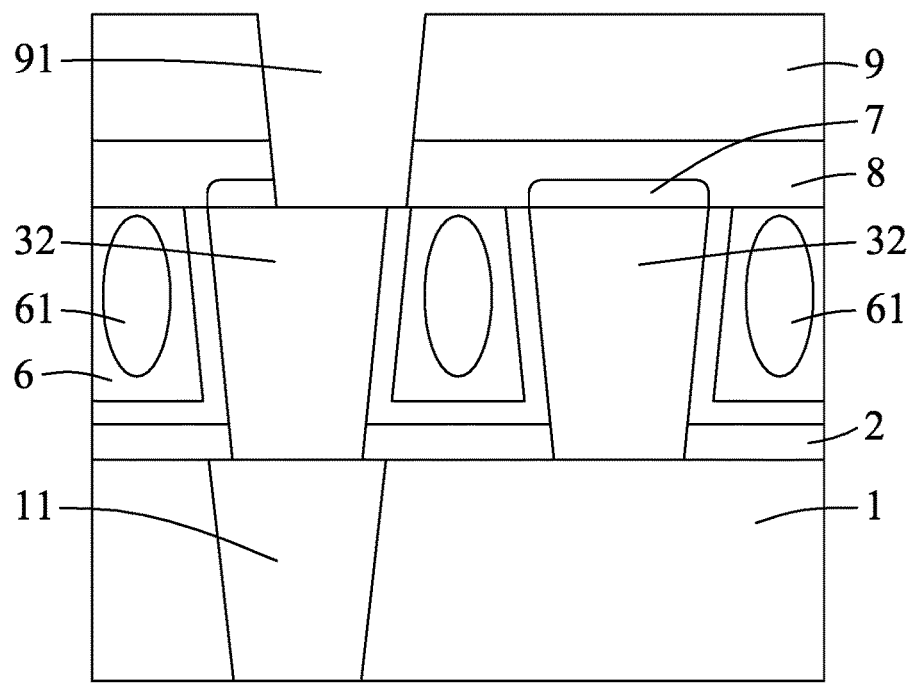
Figure 36:
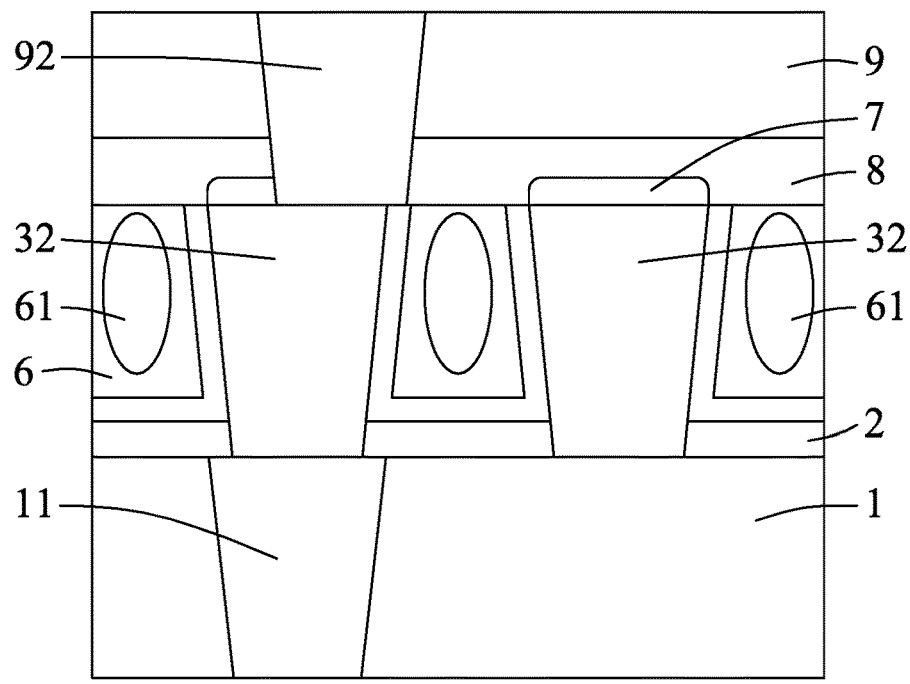

Referring to the example illustrated in FIGS. 18 and 19, a planarization treatment (for example, CMP) is then implemented to remove excess of the first electrically conductive material, portions of the spacer layers 401, and the patterned dielectric capping layer 306 until top surfaces of the first electrically conductive features 309 and the patterned dummy layer 305 to be horizontally flush with each other.

The method 500 then proceeds to block 510 where a conductive material is selectively deposited on the first electrically conductive features to form a conductive capping layer. Referring to the example illustrated in FIG. 20, the first electrically conductive features 309 are then subjected to selective deposition of a conductive material to form a conductive capping layer 50 such that the first electrically conductive features 309 are covered by the conductive capping layer 50 and the spacer layers 401. Details regarding the formation of the conductive capping layer 50 are the same as or similar to those regarding the formation of the conductive capping layer 50 described above with reference to FIG. 7.

The method 500 then proceeds to block 512 where a plurality of recesses are formed among the first electrically conductive features. Referring to the example illustrated in FIGS. 20 and 21, the patterned dummy layer 305 is etched away so as to form a plurality of recesses 402 among the first electrically conductive features 309. Details regarding the formation of the recesses 402 are the same as or similar to those regarding the formation of the recesses 402 described above with reference to FIGS. 7 and 8.

The method 500 then proceeds to block 514 where an etch stop layer is conformally formed to cover the spacer layers and the conductive capping layer. Referring to the example illustrated in FIG. 22, a second etch stop layer 60 is formed in the recesses 402 and over the first electrically conductive features 309, and is conformally deposited to cover the patterned dielectric base layer 305', the spacer layers 401, and the conductive capping layer 50. Specifically, the second etch stop layer 60 is conformed in profile to a combined profile of the first electrically conductive features 309, the spacer layers 401, and the conductive capping layer 50.

Details regarding the conformal deposition of the second etch stop layer 60 are the same as or similar to those regarding the conformal deposition of the second etch stop layer 60 described above with reference to FIG. 9. The second etch stop layer 60 includes a top portion 601 covering the conductive capping layer 50, and a surrounding portion 602 extending downwardly from the top portion 601 to cover the upper spacer sub-layer 4012 of the at least one of the spacer layers 401 and remaining ones of the spacer layers 401.

The method 500 then proceeds to block 516 where a dielectric layer having air gaps is formed. Referring to the example illustrated in FIGS. 22 and 23, a dielectric material is deposited in the recesses 402 and over the first electrically conductive features 309 (specifically, on the second etch stop layer 60) to form a second low-k dielectric layer 70 which has air gaps 701 among the first electrically conductive features 309. Details regarding the formation of the second low-k dielectric layer 70 having the air gaps 701 are the same as or similar to those regarding the formation of the second low-k dielectric layer 70 having the air gaps 701 described above with reference to FIG. 10.

The method 500 then proceeds to block 518 where at least one hole is formed in the dielectric layer. Referring to the example illustrated in FIG. 24, the second low-k dielectric layer 70, the top portion 601 of the second etch stop layer 60, and the conductive capping layer 50 are patterned by one or more etching processes (for example, dry etching, wet etching, or a combination thereof) through a pattern opening of a patterned mask layer (now shown) to form at least one hole 702 in the second low-k dielectric layer 70. Specifically, the at least one hole 702 penetrates through the second low-k dielectric layer 70, the top portion 601 of the second etch stop layer 60, and the conductive capping layer 50, such that at least one of the first electrically conductive features 309 is exposed from the at least one hole 702, respectively. Specifically, the hole 702 penetrates through the top portion 601 of the second etch stop layer 60 and is positioned within the top portion 601 of the second etch stop layer 60.

The method 500 then proceeds to block 520 where at least one second electrically conductive feature is formed. Referring to the example illustrated in FIGS. 24 and 25, a second electrically conductive material is filled into the at least one hole 702 to form at least one second electrically conductive feature 703 electrically connected to the at least one of the first electrically conductive features 309, respectively. In patterning the second low-k dielectric layer 70, the top portion 601 of the second etch stop layer 60, and the conductive capping layer 50, the at least one hole 702 penetrates through the top portion 601 of the second etch stop layer 60 and is positioned within the top portion 601 of the second etch stop layer 60, such that the second electrically conductive feature 703 is formed to penetrate through the top portion 601 of the second etch stop layer 60 and to be positioned within the top portion 601 of the second etch stop layer 60.

The second electrically conductive material may be the same as or different from the first electrically conductive material, and may be, for example, Cu, Al, Au, Ag, W, Co, Ru, Ta, etc., or alloys thereof. The second electrically conductive material may be provided as multiple layers having varying composition, and may be filled into the at least one hole 702 by a suitable process as is known in the art of semiconductor fabrication, such as electroless plating, electroplating, sputter deposition, or CVD, but not limited thereto. Details regarding the formation of at least one second electrically conductive feature 703 are the same as or similar to those regarding the formation of the first electrically conductive features 309 described above with reference to FIGS. 5 and 6. In addition, similarly to that described above with reference to FIGS. 5 and 6, before filling copper or the like into the at least one hole 702, the at least one hole 702 may be lined with a barrier layer 704 that prevents electromigration.

The at least one second electrically conductive feature 703 thus formed penetrates through the second low-k dielectric layer 70, the top portion of the second etch stop layer 60, and the conductive capping layer 50, and is electrically connected to the at least one of the first electrically conductive features 309, respectively. Specifically, the at least one second electrically conductive feature 703 penetrates through the top portion 601 of the second etch stop layer 60 and is positioned within the top portion 601 of the second etch stop layer 60.

Referring to FIGS. 26 to 36, a method for manufacturing a semiconductor structure having air gaps includes the steps of: sequentially depositing a first etch stop layer 2, a first low-k dielectric layer 3, and a first dielectric capping layer 4 on an interconnect layer 1, which is disposed over a substrate (not shown) and which is formed with an interconnect 11 (for example, an electrically conductive via); forming a plurality of first openings 31 in the first low-k dielectric layer 3 through one or more etching processes; filling a first electrically conductive material into the first openings 31 to form a plurality of first electrically conductive features 32, one of which is electrically connected to the interconnect 11; implementing a planarization treatment (for example, CMP) to remove excess of the first electrically conductive material and the first dielectric capping layer 4 until the first low-k dielectric layer 3 is exposed; removing the first low-k dielectric layer 3 through an etching process; conformally depositing a second dielectric capping layer 5 to cover the first electrically conductive features 32 and the first etch stop layer 2; depositing a second low-k dielectric layer 6 on the second dielectric capping layer 5 to form air gaps 61 among the first electrically conductive features 32; implementing a planarization treatment (for example, CMP) to remove excess of the second low-k dielectric layer 6 and the top portions of the second dielectric capping layer 5 until the first electrically conductive features 32 are exposed; selectively depositing a metal capping layer 7 on the first electrically conductive features 32; sequentially depositing a second etch stop layer 8 and a third low-k dielectric layer 9 on the metal capping layer 7; forming a second opening 91 through an etching process to permit the one of the first electrically conductive features 32 to be exposed from the second opening 91; and filling a second electrically conductive material into the second opening 91 to form a second electrically conductive feature 92 electrically connected to the one of the first electrically conductive features 32.

In the method for manufacturing the semiconductor structure 200, 600, the air gaps 701 are formed among the first electrically conductive features 309, and the conductive capping layer 50 is selectively deposited on the first electrically conductive features 309, so the semiconductor structure 200, 600 thus manufactured can provide both a relatively low capacitance and a relatively low resistance. Therefore, the RC performance of the semiconductor structure 200, 600 can be improved significantly. In addition, the first electrically conductive features 309 are covered by the conductive capping layer 50 and the spacer layers 401 prior to formation of the recesses 402. Therefore, the first electrically conductive features 309 are not damaged during the etching away of the patterned dummy layer 305 to form the recesses 402. Furthermore, since the conductive capping layer 50 is selectively deposited on the first electrically conductive features 309 prior to formation of the second low-k dielectric layer 70 and the second etch stop layer 60, the at least one hole 702 for forming the at least one second electrically conductive feature 703 can be formed directly in the second low-k dielectric layer 70 by patterning without the planarization treatment such as CPM, and the cost for forming the at least one second electrically conductive feature 703 can thereby be reduced. Moreover, the second etch stop layer 60 is conformally deposited to include the top portion 601 that covers the conductive capping layer 50 and the surrounding portion 602 that extends downwardly from the top portion 601 to cover the spacer layers 401. The at least one hole 702 can be formed within the top portion 601 of the second etch stop layer 60 during patterning for forming the at least one hole 702, such that the at least one second electrically conductive feature 703 can be formed within the top portion 601 of the second etch stop layer 60. Therefore, the metal leakage issue can be prevented.

In accordance with some embodiments of the present disclosure, a method for manufacturing a semiconductor structure includes forming a trench in a dielectric structure; forming a spacer layer on a lateral surface of the dielectric structure exposed by the trench; after forming the spacer layer, forming a first electrically conductive feature in the trench; removing at least portion of the dielectric structure to form a recess; forming an etch stop layer in the recess and over the first electrically conductive feature; and after forming the etch stop layer, depositing a dielectric layer in the recess and over the first electrically conductive feature.

In accordance with some embodiments of the present disclosure, a semiconductor structure includes a first interconnect structure and a second interconnect structure. The first interconnect structure includes at least one electrically conductive element. The second interconnect structure is disposed on the first interconnect structure, and includes a plurality of first electrically conductive features, a plurality of spacer layers, an etch stop layer, and a dielectric layer. The first electrically conductive features are spaced apart from each other, and at least one of first electrically conductive features is electrically connected to the at least one electrically conductive element, respectively. The spacer layers laterally cover the first electrically conductive features. The etch stop layer conformally covers the spacer layers and is disposed over the first electrically conductive features. The dielectric layer is disposed on the etch stop layer.

In accordance with some embodiments of the present disclosure, a semiconductor structure includes a first interconnect structure including an electrically conductive element; an electrically conductive feature electrically connected to the electrically conductive element; a spacer layer laterally covering the electrically conductive feature; a conductive capping layer disposed on the electrically conductive feature; an etch stop layer conformally covering the spacer layer and the conductive capping layer; and a dielectric layer surrounding the electrically conductive feature, the spacer layer, and the etch stop layer, and including an air gap adjacent to the electrically conductive feature.

The foregoing outlines features of several embodiments so that those skilled in the art may better understand the aspects of the present disclosure. Those skilled in the art should appreciate that they may readily use the present disclosure as a basis for designing or modifying other processes or structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method for manufacturing a semiconductor structure, comprising:
    forming a trench in a dielectric structure;
    forming a spacer layer on a lateral surface of the dielectric structure exposed by the trench;
    after forming the spacer layer, forming a first conductive feature in the trench;
    removing at least portion of the dielectric structure to form a recess;
    forming an etch stop layer in the recess and over the first conductive feature; and
    after forming the etch stop layer, depositing a dielectric layer in the recess and over the first conductive feature.

2. The method according to claim 1, further comprising, prior to forming the recess, selectively forming a conductive capping layer on the first conductive feature such that the first conductive feature is covered by the conductive capping layer and the spacer layer.

3. The method according to claim 1, wherein the dielectric layer is formed with an air gap adjacent to the first conductive feature.

4. The method according to claim 1, further comprising, after depositing the dielectric layer,
    forming a hole in the dielectric layer such that the first conductive feature is exposed from the hole; and
    forming a second conductive feature in the hole to electrically connect to the first conductive feature.

5. The method according to claim 4, wherein
    the etch stop layer includes a top portion disposed over the first conductive feature, and a surrounding portion extending downwardly from the top portion to cover the spacer layer; and
    the hole penetrates through the top portion of the etch stop layer and is positioned within the top portion of the etch stop layer, such that the second conductive feature is formed to penetrate through the top portion of the etch stop layer and to be positioned within the top portion of the etch stop layer.

6. The method according to claim 2, further comprising thermally annealing the conductive capping layer.

7. The method according to claim 1, further comprising forming a via opening in the dielectric layer, the via opening being disposed below and spatially, communicated with the trench.

8. The method according to claim 7, wherein the spacer layer is further formed in the lateral surface of the dielectric structure exposed by the via opening, such that the spacer layer includes
    a lower spacer sub-layer formed on a lower portion of the lateral surface of the dielectric structure exposed by the via opening, and
    an upper spacer sub-layer which is formed on an upper portion of the lateral surface of the dielectric structure exposed by the trench, and which is separated from the lower spacer sub-layer.

9. The method according to claim 8, wherein the etch stop layer covers the upper spacer sub-layer.

10. A method for manufacturing a semiconductor structure, comprising:
    forming a spacer layer to laterally cover a first conductive feature so as to separate the first conductive feature from a first dielectric layer;
    selectively forming a conductive capping layer on the first conductive feature such that the first conductive feature is covered by the conductive capping layer and the spacer layer;
    removing the first dielectric layer to form a recess adjacent to the spacer layer; and
    depositing a second dielectric layer in the recess to form an air gap adjacent the spacer layer.

11. The method according to claim 10, wherein the spacer layer and the conductive capping layer are formed prior to removing the first dielectric layer.

12. The method according to claim 10, further comprising, prior to depositing the second dielectric layer in the recess to form the air gap, conformally forming an etch stop layer on the conductive capping layer and the spacer layer.

13. The method according to claim 12, further comprising, after depositing the second dielectric layer to form the air gap,
    forming a hole in the second dielectric layer such that the first conductive feature is exposed from the hole; and
    forming a second conductive feature in the hole to electrically connect to the first conductive feature.

14. The method according to claim 13, wherein
    the etch stop layer includes a top portion formed on the conductive capping layer, and a surrounding portion extending downwardly from the top portion to laterally cover the spacer layer; and
    the hole penetrates through the top portion of the etch stop layer and is positioned within the top portion of the etch stop layer, such that the second conductive feature is formed to penetrate through the top portion of the etch stop layer and to be positioned within the top portion of the etch stop layer.

15. The method according to claim 13, wherein forming the spacer layer to laterally cover the first conductive feature includes:
    forming a trench in the first dielectric layer; and
    forming the spacer layer on a lateral surface of the first dielectric layer exposed by the trench.

16. The method according to claim 15, further comprising forming a via opening in the first dielectric layer, the via opening being disposed below and spatially communicated with the trench.

17. The method according to claim 16, wherein the spacer layer is further formed in the lateral surface of the first dielectric layer exposed by the via opening, such that the spacer layer includes
- a lower spacer sub-layer that is formed on a lower portion of the lateral surface of the first dielectric layer exposed by the via, opening, and
- an upper spacer sub-layer that is formed on an upper portion of the lateral surface of the first dielectric layer exposed by the trench, and that is separated from the lower spacer sub-layer,
- wherein the etch stop layer covers the upper spacer sub-layer.

18. A method for manufacturing a semiconductor structure, comprising:
- forming at least two trenches in a first dielectric layer, adjacent two of the trenches being separated from each other by a portion of the first dielectric layer;
- forming a spacer layer on a lateral surface of the first dielectric layer exposed by each of the trenches;
- forming first conductive features in the trenches, respectively, such that each of the first conductive features is laterally covered by the spacer layer;
- selectively forming a conductive capping layer on each of the first conductive features such that each of the first conductive features is covered by the conductive capping layer and the spacer layer;
- after forming the spacer layer and the conductive capping layer to cover each of the first conductive features, removing the first dielectric layer to form a recess between adjacent two of the first conductive features; and
- depositing a second dielectric layer in the recess to form an air gap between the adjacent two of the first conductive features.

19. The method according to claim 18, further comprising, prior to depositing the second dielectric layer in the recess to form the air gap, conformally forming an etch stop layer on the conductive capping layer and the spacer layer.

20. The method according to claim 19, further comprising, after depositing the second dielectric layer to form the air gap:
- forming a hole in the second dielectric layer such that the first conductive feature is exposed from the hole; and
- forming a second conductive feature in the hole to electrically connect to the first conductive feature, wherein:
- the etch stop layer includes a top portion formed on the conductive capping layer, and a surrounding portion extending downwardly from the top portion to laterally cover the spacer layer; and
- the hole penetrates through the top portion of the etch stop layer and is positioned within the top portion of the etch stop layer, such that the second conductive feature is formed to penetrate through the top portion of the etch stop layer and to be positioned within the op portion of the etch stop layer.

\* \* \* \* \*